(12) United States Patent
Niiyama et al.

(10) Patent No.: US 8,093,626 B2
(45) Date of Patent: Jan. 10, 2012

(54) NORMALLY-OFF FIELD EFFECT TRANSISTOR USING III-NITRIDE SEMICONDUCTOR AND METHOD FOR MANUFACTURING SUCH TRANSISTOR

(75) Inventors: Yuki Niiyama, Tokyo (JP); Shinya Ootomo, Tokyo (JP); Tatsuyuki Shinagawa, Tokyo (JP); Takehiko Nomura, Tokyo (JP); Seikoh Yoshida, Tokyo (JP); Hiroshi Kambayashi, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 26 days.

(21) Appl. No.: 12/308,401

(22) PCT Filed: Jun. 14, 2007

(86) PCT No.: PCT/JP2007/061993
§ 371 (c)(1),
(2), (4) Date: Jul. 8, 2010

(87) PCT Pub. No.: WO2007/145279
PCT Pub. Date: Dec. 21, 2007

(65) Prior Publication Data
US 2010/0283083 A1    Nov. 11, 2010

(30) Foreign Application Priority Data
Jun. 15, 2006    (JP) .................................. 2006-166537

(51) Int. Cl.
*H01L 29/78* (2006.01)
*H01L 21/66* (2006.01)

(52) U.S. Cl. ................ 257/192; 257/183; 257/E29.255; 257/E21.521; 257/E21.172; 438/17; 438/184

(58) Field of Classification Search .................. 257/183, 257/192, 344, 356, 408, 429, 502, E29.255, 257/E21.521, E21.172, E21.427, E29.315, 257/E29.268, E29.133; 438/17.184
See application file for complete search history.

(56) References Cited

U.S. PATENT DOCUMENTS
6,483,149 B1 * 11/2002 Mosher et al. ................ 257/356
(Continued)

FOREIGN PATENT DOCUMENTS
JP         09-307097          11/1997
(Continued)

OTHER PUBLICATIONS
Proceedings of The 53th Meeting of Applied Physics and Related Societies, (2006, Spring, Musashi institute of technology, third edition, 14a-ZE-17,p. 1513).
M. Kuraguchi et al., "Normally-off GaN-MISFET with well-controlled threshold voltage", International Workshop on Nitride Semiconductors 2006 (IWN 2006), Oct. 22-27, 2006, Kyoto, Japan, WeED1-4.
(Continued)

*Primary Examiner* — Victor A Mandala
*Assistant Examiner* — Whitney T Moore
(74) *Attorney, Agent, or Firm* — Lowe, Hauptman, Ham & Berner, LLP

(57) ABSTRACT

Provided is a normally-off field effect transistor using a III-nitride semiconductor. The transistor is provided with a III-nitride semiconductor layer grown on a substrate by including an acceptor and a donor; a gate insulating film which is formed on the III-nitride semiconductor layer to have a thickness to be at a prescribed threshold voltage based on the concentration of the acceptor and that of the donor; a gate electrode formed on the gate insulating film; a first source/drain electrode formed on the III-nitride semiconductor layer to one side of and separate from the gate electrode, directly or via a high dopant concentration region; and a second source/drain electrode formed away from the gate electrode and the first source/drain electrode, on or under the III-nitride semiconductor layer, directly or via a high dopant concentration region.

6 Claims, 17 Drawing Sheets

U.S. PATENT DOCUMENTS

2003/0082860 A1* 5/2003 Yoshida et al. ............... 438/184
2008/0121927 A1* 5/2008 Matocha et al. ............. 257/183

FOREIGN PATENT DOCUMENTS

JP 2001-320054 11/2001
JP 2003-059948 2/2003
JP 2004-260140 9/2004

OTHER PUBLICATIONS

Huang W, Khan T, Chow T P: Enhancement-Mode n-Channel GaN MOFETs on p and n-GaN/Sapphire substrates. In: 18th International Symposium on Power Semiconductor Devices and ICs (ISPSD) 2006 (Italy), 10-1.

* cited by examiner (a)

(b)

(c)

(d)

(a)

(b)

(c)

(d)

(a)

(b)

(c)

(a)

(b)

(c)

(a)

(b)

(c)

NORMALLY-OFF FIELD EFFECT TRANSISTOR USING III-NITRIDE SEMICONDUCTOR AND METHOD FOR MANUFACTURING SUCH TRANSISTOR

TECHNICAL FIELD

The present invention relates to a normally-off field effect transistor having a III-nitride semiconductor and a manufacturing method thereof. More particularly, the present invention relates to a normally-off field effect transistor having a III-nitride semiconductor layer used as a layer for moving carriers and a manufacturing method thereof.

BACKGROUND ART

Among III-V compound semiconductors, GaN is known to have a larger energy band gap of 3.4 eV, and an indirect transition conductive band level thereof is at 1.5 eV or more over the valence band level. Besides, a saturation electron velocity of GaN is about $2.5 \times 10^7$ cm/sec, and a breakdown voltage thereof is about $5 \times 10^6$ V/cm, both greater than those of Si, GaAs and SiC.

Accordingly, GaN can be used as a material for high-speed power transistors.

As one electronic device using GaN, there are a MESFETs (Metal-Semiconductor Field Effect Transistor) as disclosed in Patent document 1 and a high electron mobility transistor as disclosed in Patent document 2.

The MESFETs has, for example, as shown in FIG. 19, a un-doped GaN layer 102 and an n type GaN channel layer 103 formed sequentially on a substrate 101, a gate electrode 104 in Schottky contact with the n type GaN channel layer 103, and a source electrode 105 and a drain electrode 106 which are formed to the respective sides of the gate electrode 104 and are in ohmic contact with the channel layer 103. The reference numeral 107 in FIG. 19 denotes a depletion layer.

In addition, the high electron mobility transistor has an un-doped GaN electron moving layer 112 and an n type AlGaN electron supplied layer 113 sequentially deposited on a substrate 111 as shown in FIG. 20, and further has a gate electrode 114 in Schottky contact with the n AlGaN electron supplied layer 113 and a source electrode 115 and a drain electrode 116 which are formed to the respective sides of the gate electrode 114 and are in ohmic contact with the n AlGaN electron supplied layer 113. In FIG. 20, the reference numeral 117 denotes a two-dimensional electron gas and the reference numeral 118 denotes a depletion layer.

The transistors shown in FIGS. 19 and 20 are both general normally-on transistors. When a transistor is used as a power supply device for general purpose, a normally-off type is required in terms of fail safe. The normally-off field effect transistor is disclosed in Patent documents 3 and 4 in which an insulating film is placed between a gate electrode and a GaN layer.

However, the conventional normally-off transistors using GaN materials have a larger parasitic resistance, and there is a problem that adequate off characteristics cannot be assured when the gate voltage is 0 V.

Meanwhile, Non-patent document 1 discloses a normally-off high electron mobility transistor in which a gate threshold voltage becomes 0 V by performing fluorine plasma processing after forming a gate electrode.

Used as a field effect transistor using a III-nitride semiconductor are an AlGaN/GaN HEMT (for example, refer to Non-patent document 2) and a GaN MOSFET (refer to Non-patent document 3). These have higher saturation electron mobility and higher dielectric breakdown voltage than those of conventionally using a III compound semiconductor such as Si, GaAs, InP and the like, and they are suitable for power devices.

Patent Document 1: Japanese Patent Publication No. 9-307097
Patent Document 2: Japanese Patent Publication No. 2003-59948
Patent Document 3: Japanese Patent Publication No. 2001-320054
Patent Document 4: Japanese Patent Publication No. 2004-260140
Non-Patent Document 1: Proceedings of The 53th Meeting of Applied Physics and Related Societies, (2006, Spring, Musashi institute of technology, third edition, 14a-ZE-17, p. 1513)
Non-Patent Document 2: M. Kuraguchi et al., "Normally-off GaN-MISFET with well-controlled threshold voltage", International Workshop on Nitride Semiconductors 2006 (IWN 2006), Oct. 22-27, 2006, Kyoto, Japan, WeED1-4
Non-Patent Document 3: Huang W, Khan T, Chow T P: Enhancement-Mode n-Channel GaN MOFETs on p and n-GaN/Sapphire substrates.
In: 18th International Symposium on Power Semiconductor Devices and ICs (ISPSD) 2006 (Italy), 10-1.

DISCLOSURE OF INVENTION

Problems to be Solved by the Invention

However, it is difficult to increase the threshold voltage of the normally-off transistor using the GaN material to, for example, 1 V or more, and Non-patent document 1 discloses the threshold voltage set to only 0 V.

In this point, the threshold voltage of the normally-off transistor can be achieved by making the channel layer of the MESFET or the electron supplied layer of the high electron mobility transistor grow thinner, and further adjusting a dopant concentration in the channel layer or the electron supplying layer to form a deeper depletion layer. However, it is also difficult to accurately control the thickness of the channel layer or the electron supplying layer or the dopant concentration, and to obtain a stable threshold voltage for each device.

The AlGaN/GaN HEMT is widely studied as a field effect transistor using III-nitride, however, its threshold voltage is about +1 V or below. In addition, for the GaN MOSFET, there are reported a device having higher mobility and a device having a higher breakdown voltage of near 1,000 V. However, a device having both of higher mobility and a higher breakdown voltage has not yet realized.

An object of the present invention is to provide a normally-off field effect transistor using a III-nitride semiconductor and a manufacturing method thereof capable of presenting a higher gate threshold voltage than a conventional one and controlling the threshold voltage to a desired value.

Another object of the present invention is to provide a normally-off field effect transistor using a III-nitride semiconductor that is a normally-off semiconductor device and can achieve both a higher breakdown voltage and a larger current.

Means for Solving the Problem

In order to solve the above-mentioned problems, according to a first aspect of the present invention, a normally-off field effect transistor using a III-nitride semiconductor comprises:

a III-nitride semiconductor layer containing acceptor and donor to grow on a substrate; a gate insulating film formed on the III-nitride semiconductor layer and controlled having such a thickness that a predetermined threshold voltage is obtained based on a concentration of the acceptor and a concentration of the donor; a gate electrode formed on the gate insulating film; and a source electrode and a drain electrode formed on the III-nitride semiconductor layer via respective contact regions.

A second aspect of the present invention is characterized in that in the above-described normally-off field effect transistor using the III-nitride semiconductor, the gate insulating film has an equivalent oxide film thickness of from 20 nm to 150 nm.

A third aspect of the present invention is characterized in that in the above-described normally-off field effect transistor using the III-nitride semiconductor, the gate insulating film is a film of any one of silicon dioxide, silicon nitride, silicon oxynitride, alumina, gallium oxide, aluminum nitride, magnesium oxide, gadolinium oxide, scandium oxide, zirconium oxide, hafnium oxide, tantalum oxide, and titanium oxide.

A fourth aspect of the present invention is characterized in that in the above-described normally-off field effect transistor using the III-nitride semiconductor, the III-nitride semiconductor layer is a p type layer and a dopant is any one selected from magnesium, carbon, beryllium, and zinc.

A fifth aspect of the present invention is characterized in that in the above-described normally-off field effect transistor using the III-nitride semiconductor, the concentration of the acceptor in the III-nitride semiconductor layer ranges from $5 \times 10^{15}$ cm$^{-3}$ to $5 \times 10^{17}$ cm$^{-3}$.

A sixth aspect of the present invention is characterized in that in the above-described normally-off field effect transistor using the III-nitride semiconductor, the concentration of the donor in the III-nitride semiconductor layer ranges from $1 \times 10^{15}$ cm$^{-3}$ to $2 \times 10^{16}$ cm$^{-3}$.

A seventh aspect of the present invention is characterized in that in the above-described normally-off field effect transistor using the III-nitride semiconductor, a reducing electric field region is formed between at least one of the source electrode and the drain electrode and the III-nitride semiconductor layer just below the gate electrode An eighth aspect of the present invention is characterized in that in the above-described normally-off field effect transistor using the III-nitride semiconductor, the gate electrode is polycrystalline silicon, polycrystalline silicon germanium, aluminum, gold, paradigm, platinum, nickel tantalum, molybdenum, tungsten or any silicide thereof.

A ninth aspect of the present invention is a method for manufacturing a normally-off field effect transistor using a III-nitride semiconductor comprising the steps of: making a III-nitride semiconductor layer containing acceptor and donor grow on a substrate; measuring an effective dopant concentration of the III-nitride semiconductor layer; determined such a thickness of a gate insulating film to be formed on the III-nitride semiconductor layer that a predetermined threshold voltage is obtained based on the effective dopant concentration; forming the gate insulating film with the thickness on the III-nitride semiconductor layer; and forming a gate electrode on the gate insulating film.

Another aspect of the present invention is a field effect transistor using a III-nitride semiconductor having: a first conductive type semiconductor layer formed on a substrate using the III-nitride semiconductor; a gate electrode formed via a gate insulating film in a channel region of the semiconductor layer; a source electrode and a drain electrode; and a second conductive type contact region formed in ohmic contact with the source electrode and a second conductive type contact region formed in ohmic contact with the drain electrode, the field effect transistor comprising: a RESURF region formed in the channel region of the semiconductor layer and in adjacent to the contact region in contact with the drain electrode, the RESURF region having a sheet carrier concentration ranging from $1 \times 10^{12}$ cm$^{-2}$ to $5 \times 10^{13}$ cm$^{-2}$, inclusive.

According to this aspect, as the RESURF region is provided the breakdown voltage can be increased. Besides, as the sheet carrier concentration is set to range from $1 \times 10^{12}$ cm$^{-2}$ to $5 \times 10^{13}$ cm$^{-2}$, inclusive and the sheet resistance of the RESURF region is set to range from 100 Ω/sq. and 10 kΩ/sq., inclusive, it is possible to realize a field effect transistor using a III-nitride semiconductor capable of achieving higher breakdown voltage and larger current.

Here, the RESURF region (Reduced SURface Field: RESURF Field) is a surface electric field reducing region formed between the gate electrode and the drain electrode in the III-nitride semiconductor layer in order to increase the breakdown voltage.

The field effect transistor according to yet another aspect of the present invention is characterized in that the RESURF region having a sheet carrier concentration ranging from $5 \times 10^{12}$ cm$^{-2}$ to $5 \times 10^{13}$ cm$^{-2}$, inclusive.

According to this aspect, as the sheet carrier concentration of the RESURF region is set to fall within a range between $5 \times 10^{12}$ cm$^{-2}$ and $5 \times 10^{13}$ cm$^{-2}$, inclusive, the sheet resistance becomes smaller, and both higher breakdown voltage and larger current can be achieved.

The field effect transistor according to yet another aspect of the present invention is characterized in that the first conductive semiconductor layer is a p type GaN layer, and the RESURF region is an n type GaN layer formed by ion-implanting n type impurities into the p type GaN layer.

According to this aspect, it is possible in the N channel GaN FET to achieve both higher breakdown voltage and larger current. Besides, as the RESURF region is an n type GaN layer formed by ion-implanting n type impurities into the p type GaN layer, its sheet carrier concentration is not affected much by the p type impurity concentration of the p type GaN layer.

The field effect transistor according to yet another aspect of the present invention is characterized in that the first conductive semiconductor layer as the p type GaN layer has a p type impurity concentration ranging from $1 \times 10^{15}$ cm$^{-3}$ to $5 \times 10^{17}$ cm$^{-3}$, inclusive.

According to this aspect, as the p type impurity concentration of the semiconductor layer which is the p type GaN layer is set to fall within a range between $1 \times 10^{15}$ cm$^{-3}$ and $5 \times 10^{17}$ cm$^{-3}$, inclusive, it is possible in the normally-off field effect transistor, for example, MOS field effect transistor, to realize normally-off operation with a higher threshold, for example, a threshold of about 3-5 (V).

Besides, when the film thickness of the first conductive semiconductor layer (p type GaN layer) remains unchanged and its p impurity concentration (for example, Mg concentration) increases, the breakdown voltage is lowered. This is because when the p type impurity concentration is higher, the depletion layer under the drain-side n+ type layer (contact region in ohmic contact with the drain electrode) is reduced thereby to cause concentration of the electric field, which leads to breakdown. As the p impurity concentration (acceptor concentration) of the semiconductor layer which is the p type GaN layer is set to fall within a range from $1 \times 10^{15}$ cm$^{-3}$ to $5 \times 10^{17}$ cm$^{-3}$, inclusive, the threshold voltage of the normally-off operation can be made higher. However, after intensive study by the inventors, it has been found that the p impurity concentration is pertinent not only to the threshold voltages but also to the breakdown voltage. In other words, when the p impurity concentration is higher, the breakdown voltage is decreased for the above-mentioned reasons. As the p impurity concentration is set to fall within a range between $1\times10^{15}$ cm$^{-3}$ and $5\times10^{17}$ cm$^{-3}$, it is possible to prevent decrease of the breakdown voltage.

The field effect transistor according to yet another aspect of the present invention is characterized in that the RESURF region comprises plural regions different in sheet carrier concentration, and the sheet carrier concentration is higher in a drain electrode side area and lower in a gate electrode side area.

According to this aspect, the strength of the electric field occurring at each part of the drain end side semiconductor layer and the drain side semiconductor layer below the gate electrode can be made lower than that of the dielectric breakdown field. Accordingly, the electric field concentration is reduced more than that for the case of one RESURF region, and higher breakdown voltage can be achieved.

The field effect transistor according to yet another aspect of the present invention is characterized in that III elements used in the semiconductor layer are at least one of B, Al, Ga and In.

The field effect transistor according to yet another aspect of the present invention is characterized in that the field effect transistor is a normally-off MOS field effect transistor.

According to this aspect, it is possible, in the normally-off MOS field effect transistor, to realize normally-off operation with a higher threshold, for example, a threshold of about 3-5 (V).

Effects of the Invention

According to the present invention, the III-nitride semiconductor layer is the channel layer, and the gate electrode is formed thereover via the gate insulating film, the film thickness of the gate insulating film is set based on an effective dopant concentration of the III-nitride semiconductor layer and a target value of a threshold voltage.

Accordingly, the threshold voltage can be increased to be 1 V or more by adjusting the film thickness of the gate insulating film, and the target value of the threshold voltage can be achieved with high accuracy even when the acceptor and donor concentrations of the III-nitride semiconductor layer vary per substrate or lot.

Further, according to the present invention, it is possible to achieve a normally-off field effect transistor with higher breakdown voltage and a larger current. Particularly, the GaN field effect transistor using GaN as III-nitride semiconductor can achieve a higher breakdown voltage and lower on-state resistance than those of a conventional Si electron device, and this can make a significant contribution to downsizing and high efficiency of power source.

BRIEF DESCRIPTION OF REFERENCES

Figure 1:
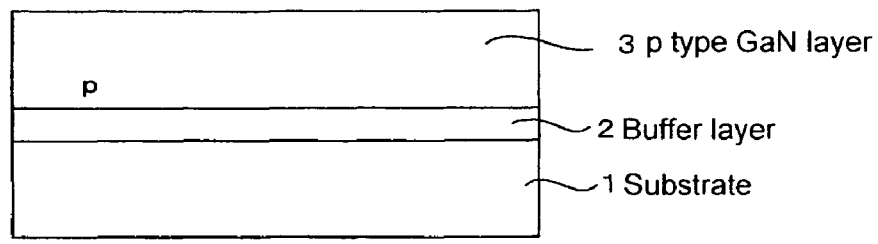
FIG. 1 is a cross sectional view (part 1) illustrating manufacturing steps of a normally-off field effect transistor according to a first embodiment of the present invention.
Figure 1:
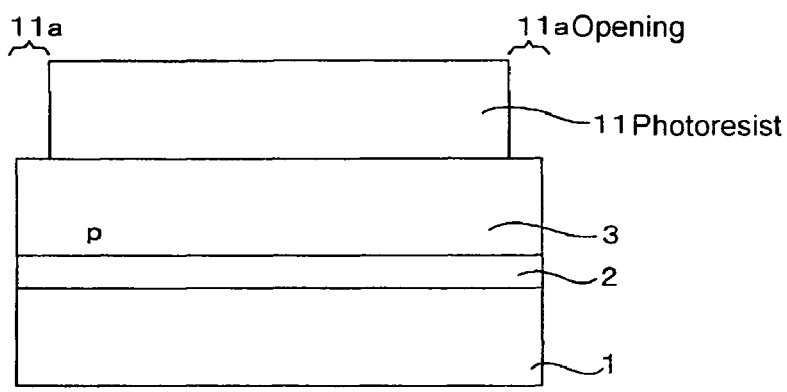
Figure 1:
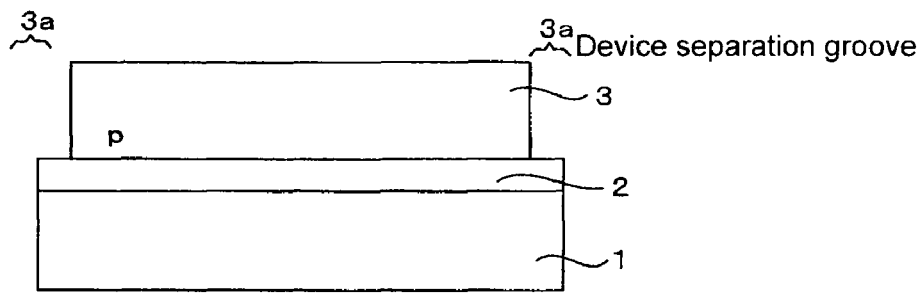
Figure 1:
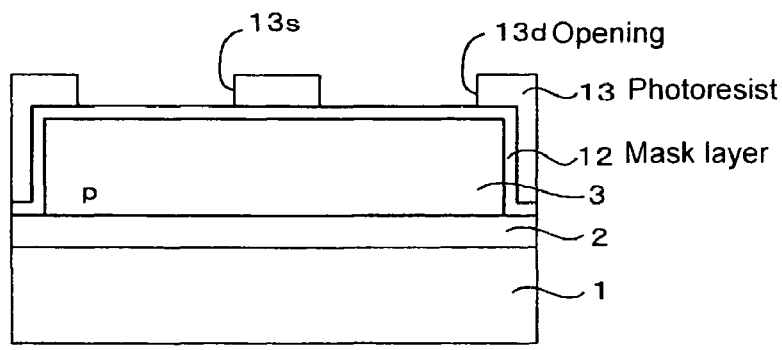

1: substrate
2: AlN buffer layer
3: p type GaN layer
4s: source region
4d: drain region
4r: RESURF region
5: insulating film
6: source electrode
7: drain electrode
8: gate electrode
31: substrate
32a: GaN buffer layer
32b: AlN buffer layer
33: n+ type GaN drain layer
34: n− type GaN layer
35: p type GaN layer
36, 36A: n+ type souse layer
41, 41A, 49: insulating film (gate insulating film)
42, 42A, 42B: source electrode
43, 43A, 43B: drain electrode
44, 44A, 44B: gate electrode
200, 200A: field effect transistor (MOSFET)
201: substrate
203: first conductive type semiconductor layer (p type GaN layer)
203a: channel region
205: gate oxide film, (gate insulating film)
206: source electrode
207: drain electrode
208: gate electrode
210, 211: second conductive type contact region (n type GaN layer)
212: RESURF region (n type GaN layer)
221, 222: RESURF region

BEST MODES FOR CARRYING OUT THE INVENTION

With reference to the drawings, embodiments of the present invention will now be described below.

First Embodiment

Figure 2:
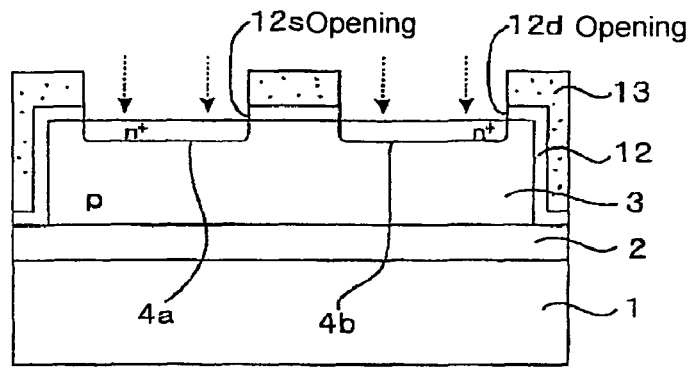
FIG. 2 is a cross sectional view (part 2) illustrating manufacturing steps of the normally-off field effect transistor according to the first embodiment of the present invention.
Figure 2:
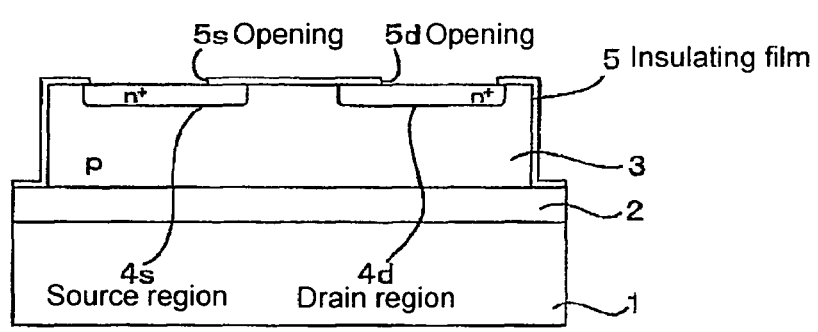
Figure 2:
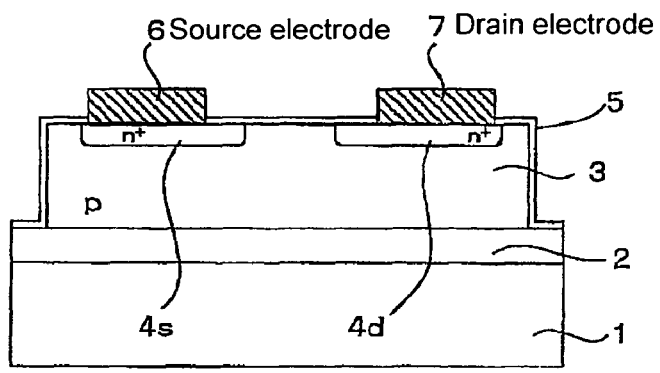
Figure 2:
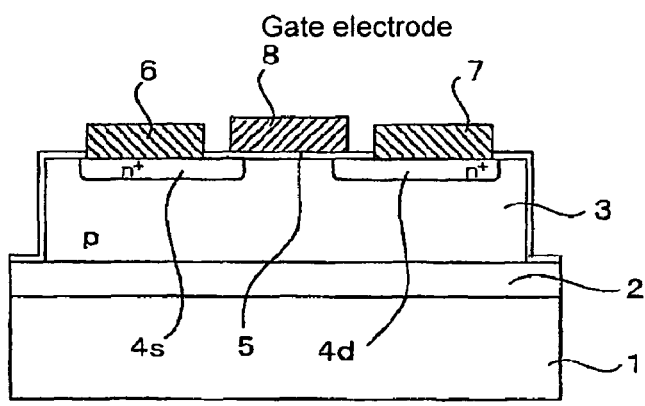

FIGS. 1 and 2 are cross sectional views showing a normally-off field effect transistor according to the first embodiment of the present invention and its manufacturing steps.

First, as shown in FIG. 1(a), an AlN buffer layer 2 having a thickness of 100 nm and a p type GaN layer 3 as a III-nitride semiconductor layer having a thickness of 1 µm are epitaxially grown on a silicon (Si) substrate 1 by the Metal Organic Chemical Vapor Deposition (MOCVD) method. Here, the substrate 1 can be a substrate of alumina, silicon carbide or the like.

The AlN buffer layer 2 grows at a substrate temperature of 1100° C. and with reaction gases of trimethylaluminum (TMA) and ammonia ($NH_3$). Besides, the p type GaN layer 3 grows at a substrate temperature of 1100° C. and with reaction gases of trimethyl gallium (TMG) and $NH_3$. Magnesium (Mg) is adopted as the p type dopant. Used as a reaction gas for doping the p type GaN layer 3 with Mg is cyclopentadienyl magnesium ($Cp_2Mg$). A dopant amount of Mg is preferably set to range from $5\times10^{16}$ cm$^{-3}$ to $5\times10^{17}$ cm$^{-3}$ and, for example, set to $5\times10^{16}$ cm$^{-3}$.

Here, the MOCVD method can be replaced with the Hydride Vapor Phase Epitaxy (HVPE) method, molecular beam epitaxy (MBE) method or the like.

Next, as shown in FIG. 1(b), the p type GaN layer 3 is coated with a photoresist 11, which is exposed and developed to form an opening 11a in a device separation region.

This is followed by, as shown in FIG. 1(c), etching the p type GaN layer 3 via the opening 11a by reactive ion etching (RIE), inductively coupled plasma (ICP) etching or the like to form a device separation groove 3a. Then, the photoresist 11 is removed by a solvent such as acetone.

Then, as shown in FIG. 1(d), on the surface of the p type GaN layer 3, a $SiO_2$ layer is formed as an ion blocking mask layer 12 having a thickness of 1 µm by CVD method. Next, the layer $SiO_2$ is coated with a photoresist 13, which is exposed and developed to form openings 13s and 13d in a source region and a drain region, respectively. Then, as shown in FIG. 2(a), the openings 13s and 13d are used to etch the ion blocking mask layer 12 with buffered hydrofluoric acid, thereby to form a source opening 12s and a drain opening 12d. Here, the source opening 12s and the drain opening 12d are spaced, for example, 1 µm away from each other.

Later, silicon as n type dopant is implanted into the p type GaN layer 3 at an acceleration voltage 190 keV and with a dose amount of $1\times10^{15}$ cm$^{-2}$ by the ion implanting method. With this implantation, a first n+ type dose region 4a and a second n+ type dose region 4b are formed under the source opening 12s and the drain opening 12d formed in the ion blocking mask layer 12, respectively. Further, the photoresist 13 is removed by a solvent and then, the ion blocking mask layer 12 is removed by hydrofluoric acid solution.

Next, on the upper surface of the p type GaN layer 3, a $SiO_2$ film is formed as a second mask layer (not shown) having a thickness of about 500 nm by the CVD method. Then, in a nitrogen (N) atmosphere, the p type GaN layer 3 is annealed five minutes at the temperature of 1300° C., and thereby impurities in the first n+ type dose region 4a and the second n+ type dose region 4b are activated to form a source region (contact region) 4s and a drain region (contact region) 4d. Further, the second mask layer is removed by hydrofluoric acid solution or the like. Here, the ambient gas in activation may be an inert gas such as argon (Ar), instead of N.

Here, as the n⁺ type source region 4s and n⁺ type drain region 4d are formed by the selective growth method of using a dielectric film such as a silicon oxide film or silicon nitride film as a mask to make the n⁺ type layer grow or the heat dissipating method.

Then, as shown in FIG. 2(b), on the surface of the p type GaN layer 3, a $SiO_2$ film is formed as an insulating film (gate insulating film) 5. The thickness of the insulating film 5 may be determined in consideration of a difference between the acceptor concentration and the residual donor concentration. Determining of the film thickness is described in detail later. Here, the material of the insulating film 5 is not limited to the silicon oxide film but may be silicon nitride ($SiN_x$), silicon oxynitride ($SiO_xN_{1-x}$), alumina ($Al_2O_3$), gallium oxide ($Ga_2O_3$), aluminum nitride (AlN), magnesium oxide (MgO), gadolinium oxide ($Gd_2O_3$), scandium oxide ($Sc_2O_3$), zirconium oxide ($ZrO_2$), hafnium oxide ($HfO_2$), tantalum oxide ($Ta_2O_5$), titanium oxide ($TiO_2$) or the like, and the thickness of such a film is shown by the equivalent oxide film described later.

Then, the insulating film 5 is coated with a photoresist (not shown), which is exposed and developed to form openings on the source region 4s and the drain region 4d, respectively. These openings are used to etch the insulating film 5 thereby to form a source electrode opening 5s and a drain electrode opening 5d in the insulating film 5 (see FIG. 2(b)).

Next, as shown in FIG. 2(c), on the n⁺ type source region 4s and the n⁺ type drain region 4d exposed in the source electrode opening 5s and the drain electrode opening 5d, respectively, a source electrode 6 and a drain electrode 7 of Ti/Al are formed by the lift-off method. The source electrode 6 and the drain electrode 7 are in ohmic contact with the n⁺ type source region 4s and the n⁺ type drain region 4d on the surface of the p type GaN layer 3. Here, a material of the source electrode 6 and the drain electrode 7 may be other than Ti/Al as long as ohmic contact is achieved.

Here, the left-off method is a method of covering a region other than the electrode formed region with a photoresist and forming a metal by sputtering or EB method, and then removing the photoresist to leave the metal film selectively in the electrode formed region.

Then, a polycrystalline silicon (poly-Si) film is deposited over the whole of the device including the insulating film 5 by the low pressure (LP) CVD method or the sputtering method.

Further, the substrate 1 entirely covered with the polycrystalline silicon film is placed in a thermal diffusion furnace in which phosphorus trichloride ($POCl_3$) gas is filled, and the polycrystalline silicon film is doped with phosphor at 900° C. and for twenty minutes.

Then, the photolithography method using a mask and an etching technique of the photoresist is adopted to make a patterning of the polycrystalline silicon film, and thereby, as shown in FIG. 2(d), the polycrystalline silicon film is left in a region between the source electrode 6 an the drain electrode 7, where there is formed a gate electrode 8. Here, the doping method of impurities into the polycrystalline silicon film may be performed by containing impurities during film deposition, thermal diffusion after film deposition or the like.

Here, the gate electrode 8 is not limited to the above, but may be a polycrystalline silicon film doped with boron, polycrystalline silicon germanium (SiGe) film, or may be a film of aluminum (Al), gold (Au), paradium (Pd), platinum (Pt), nickel (Nit), tantalum (Ta), molybdenum (Mo), tungsten (W) or silicide of any of these metals.

With these steps, the normally-off field effect transistor according to the first embodiment is manufactured.

Next description is made about the relation between the thickness of the insulating film 5 formed between the gate electrode 8 and the p type GaN layer 3 and the threshold voltage.

Figure 3:
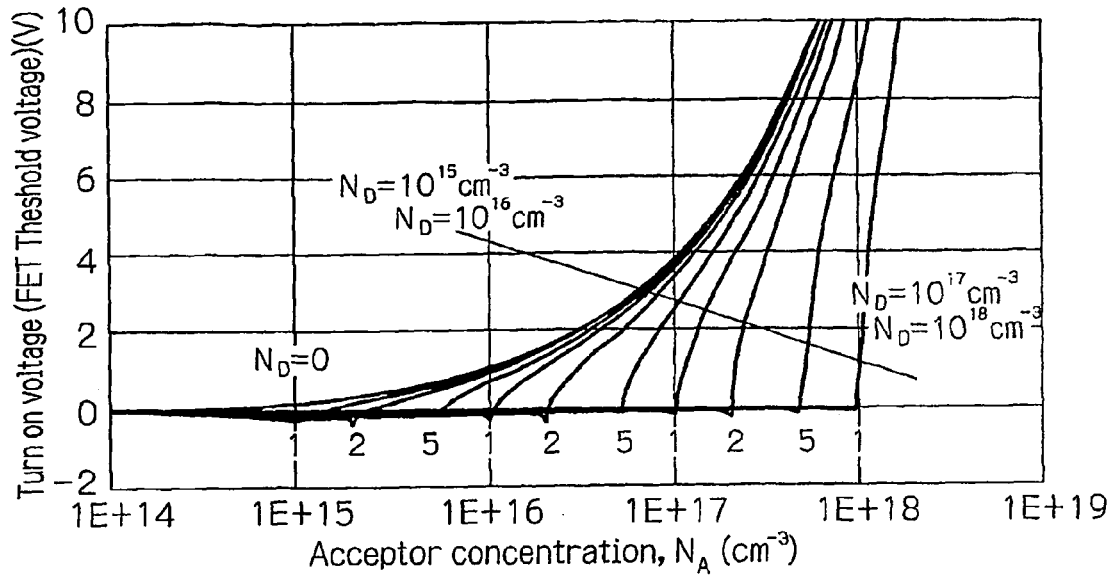
FIG. 3 is a characteristic graph of a first example of the relation of the acceptor concentration, the donor concentration and the threshold voltage of a semiconductor layer of the field effect transistor according to the embodiment of the present invention.

When Mg is used as acceptor of the p type GaN layer 3 and the acceptor level is supposed to be 200 meV, the film thickness of the insulating film (equivalent oxide film) 5 is 50 nm and the work function of the material of the gate electrode 8 is 4.1 eV, the acceptor concentration $N_A$ dependence of the threshold voltage of the gate electrode 8 of the field effect transistor at the room temperature is shown in FIG. 3. The gate electrode material having a work function of 4.1 eV includes, for example, polycrystalline silicon, aluminum, gold and the like.

Here, in the horizontal axis of FIG. 3, 1E+14 indicates $1\times10^{14}$, 1E+15 indicates $1\times10^{15}$, 1E+16 indicates $1\times10^{16}$, 1E+17 indicates $1\times10^{17}$ and 1E+18 indicates $1\times10^{18}$. These hold true for the figures described later.

The eleven characteristic lines in FIG. 3 show the relation between the acceptor concentrations $N_A$ and the threshold voltages for the residual donor concentrations $N_D$ of 0, $1\times10^{15}$ cm⁻³, $2\times10^{15}$ cm⁻³, $5\times10^{15}$ cm⁻³, $1\times10^{16}$ cm⁻³, $2\times10^{16}$ cm⁻³, $5\times10^{16}$ cm⁻³, $1\times10^{17}$ cm⁻³, $2\times10^{17}$ cm⁻³, $5\times10^{17}$ cm⁻³, and $1\times10^{18}$ cm⁻³.

Then, for the residual donor concentrations $N_D$ of $1\times10^{15}$ cm⁻³ to $2\times10^{16}$ cm⁻³, when the Mg concentration $N_A$ varies in a range of from $5\times10^{15}$ cm⁻³ to $5\times10^{17}$ cm⁻³, the threshold voltage can be set in a range of from 0 V to 9 V.

Figure 4:
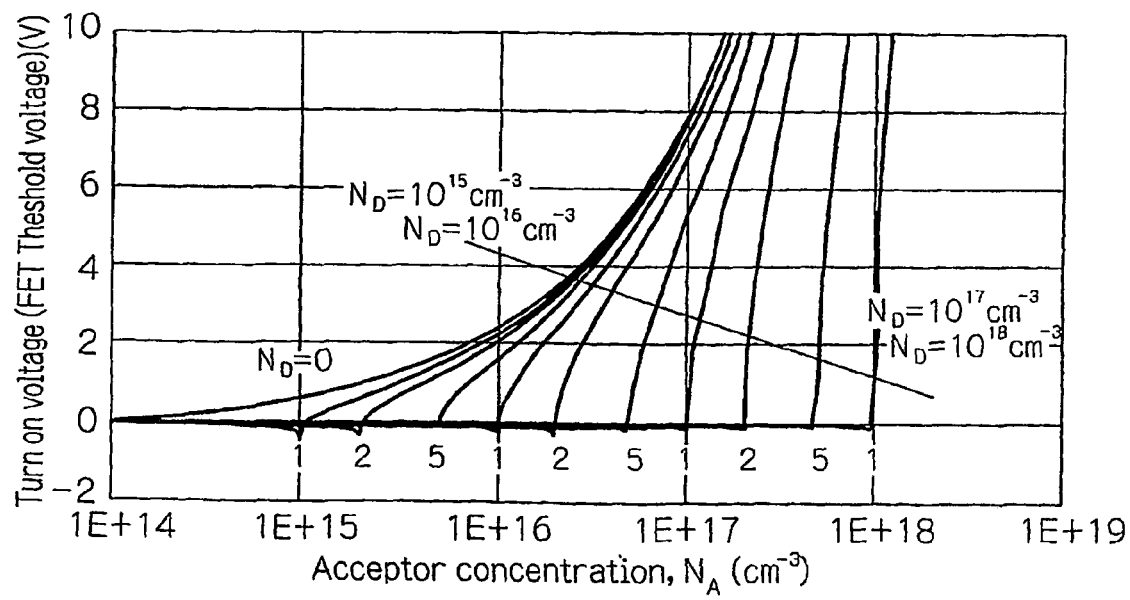
FIG. 4 is a characteristic graph of a second example of the relation of the acceptor concentration, the donor concentration and the threshold voltage of the semiconductor layer of the field effect transistor according to the embodiment of the present invention.

Next, the film thickness of the equivalent oxide film of the field effect transistor is 100 nm, other conditions are the same as those of the field effect transistor of FIG. 3, and then, acceptor concentration dependence of the threshold voltage of the gate electrode 8 at the room temperature is obtained, which result is shown in FIG. 4. The eleven curved lines in FIG. 4 show the same residual donor concentrations $N_D$ as those in FIG. 3 from the left hand to the right hand.

Then, in FIG. 4, for the residual donor concentrations $N_D$ of $1\times10^{15}$ cm⁻³ to $2\times10^{16}$ cm⁻³, when the Mg concentration $N_A$ varies in a range of from $5\times10^{15}$ cm⁻³ to $5\times10^{17}$ cm⁻³, the threshold voltage can be set in a range of from 0 V to 10 V or more.

When the characteristics of FIG. 4 is compared with those of FIG. 3, it is seen that for eleven residual donor concentration lines ND, when the equivalent oxide film thickness is increased to be 100 nm, the threshold voltage variation with the variation of the Mg acceptor concentration $N_A$ becomes more significant than that in FIG. 3.

Figure 5:
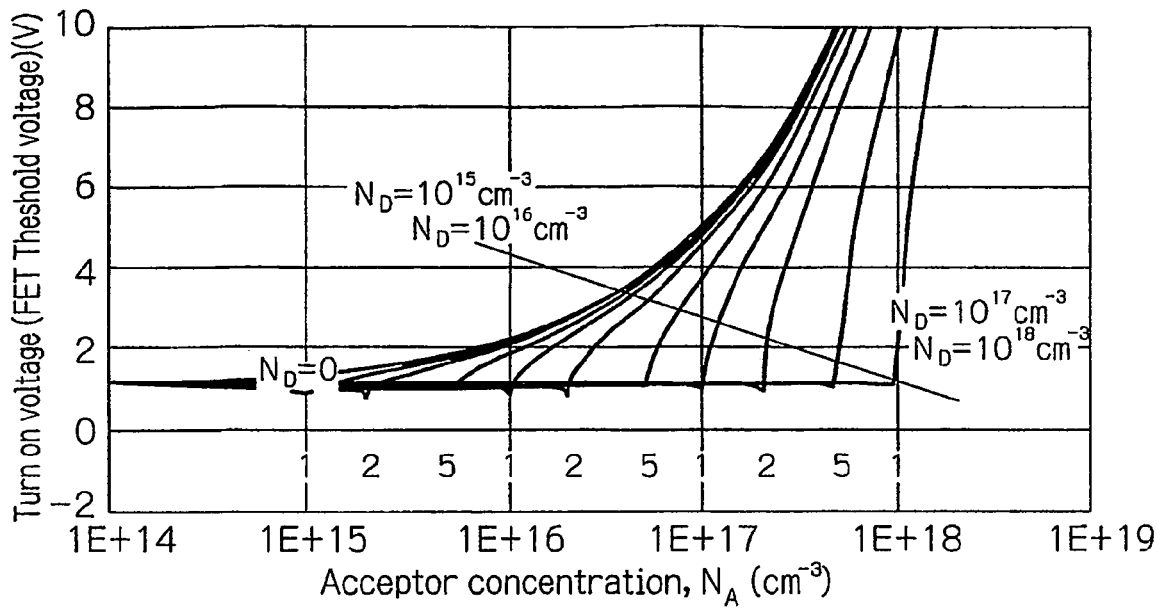
FIG. 5 is a characteristic graph of a third example of the relation of the acceptor concentration, the donor concentration and the threshold voltage of the semiconductor layer of the field effect transistor according to the embodiment of the present invention.

Next, Pt having a work function of 5.3 eV is selected as a material of the gate electrode 8, other conditions are the same as those of the field effect transistor of FIG. 3, and then, acceptor concentration $N_A$ dependence of the threshold voltage of the gate electrode 8 of the field effect transistor at the room temperature is obtained, which result is shown in FIG. 5. The eleven curved lines in FIG. 5 show the same residual donor concentrations $N_D$ as those in FIG. 3 from the left hand to the right hand.

Then, in FIG. 5, for the residual donor concentrations $N_D$ of $1\times10^{15}$ cm⁻³ to $2\times10^{16}$ cm⁻³, when the Mg concentration $N_A$ varies in a range of from $5\times10^{15}$ cm⁻³ to $5\times10^{17}$ cm⁻³, the threshold voltage can be set in a range of from 1.2 V to 10 V.

When the characteristics of FIG. 5 is compared with those of FIG. 3, it is seen that for eleven residual donor concentration lines $N_D$, the threshold voltages are wholly increased by 1.2 V with increase in the work function of the material of the gate electrode 8 although the variation of the threshold voltage with variation of Mg acceptor concentration $N_A$ is almost the same as that of FIG. 3.

Figure 6:
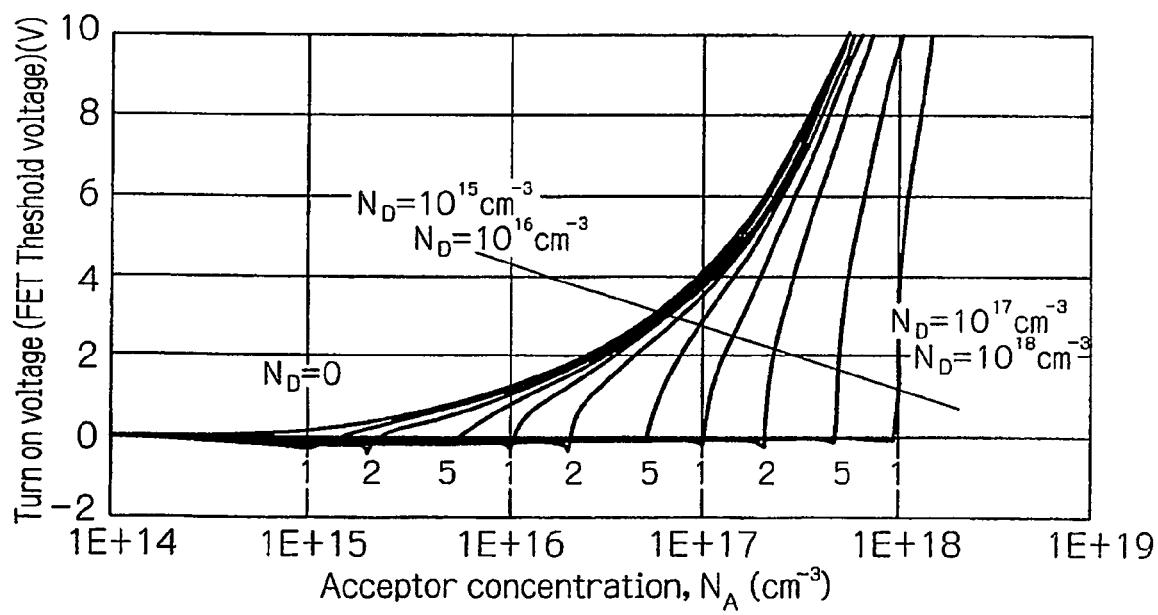
FIG. 6 is a characteristic graph of a fourth example of the relation of the acceptor concentration, the donor concentration and the threshold voltage of the semiconductor layer of the field effect transistor according to the embodiment of the present invention.

Next, beryllium (Be) is used as acceptor, the acceptor level is supposed as 70 meV, other conditions are the same as those of the field effect transistor of FIG. 3, and then, acceptor concentration $N_A$ dependence of the threshold voltage of the gate electrode 8 of the field effect transistor at the room temperature is obtained, which result is shown in FIG. 6. The eleven curved lines in FIG. 6 show the same residual donor concentrations $N_D$ as those in FIG. 3 from the left hand to the right hand.

Then, in FIG. 6, for the residual donor concentrations $N_D$ of $1 \times 10^{15}$ cm$^{-3}$ to $2 \times 10^{16}$ cm$^{-3}$, when the Be concentration $N_A$ varies in a range of from $5 \times 10^{15}$ cm$^{-3}$ to $5 \times 10^{17}$ cm$^{-3}$, the threshold voltage can be set in a range of from 0 V to 9 V.

When the characteristics of FIG. 6 is compared with those of FIG. 3, it is seen that eleven residual donor concentration lines $N_D$ are almost the same as those of FIG. 3 even when the acceptor is Be.

Figure 7:
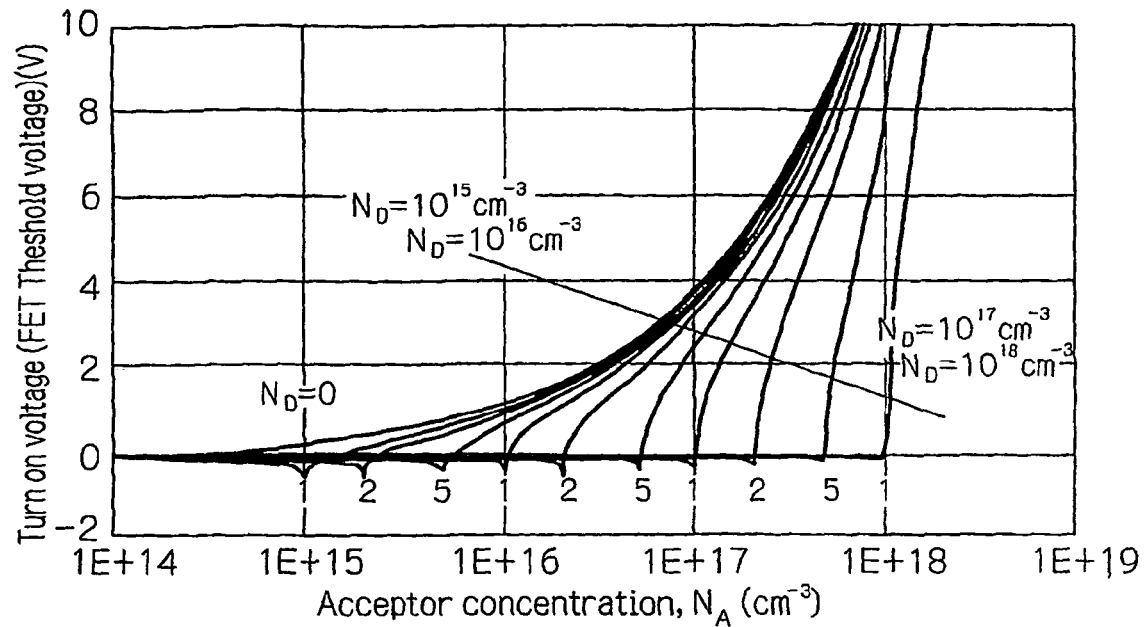
FIG. 7 is a characteristic graph of a fifth example of the relation of the acceptor concentration, the donor concentration and the threshold voltage of the semiconductor layer of the field effect transistor according to the embodiment of the present invention.

Next, zinc (Zn) is used as acceptor, the acceptor level is supposed as 300 meV, other conditions are the same as those of the field effect transistor of FIG. 3, and then, acceptor concentration dependence of the threshold voltage of the gate electrode 8 of the field effect transistor at the room temperature is obtained, which result is shown in FIG. 7. The eleven curved lines in FIG. 7 show the same residual donor concentrations $N_D$ as those in FIG. 3 from the left hand to the right hand.

Then, in FIG. 7, for the residual donor concentrations $N_D$ of $1 \times 10^{15}$ cm$^{-3}$ to $2 \times 10^{16}$ cm$^{-3}$, when the Mg concentration varies in a range of from $5 \times 10^{15}$ cm$^{-3}$ to $5 \times 10^{17}$ cm$^{-3}$, the threshold voltage can be set in a range of from 0 V to 9 V.

When the characteristics of FIG. 7 is compared with those of FIG. 3, it is seen that eleven residual donor concentration lines $N_D$ are almost the same as those of FIG. 3 even when the acceptor is Zn.

From the above, it is seen that even when the gate electrode 8 is made of the same material and the residual donor concentration $N_D$ and the acceptor concentration $N_A$ are the same, the threshold voltage varies depending on variation of the thickness of the insulating film (equivalent oxide film) 5 between the gate electrode 8 and the p type GaN layer 3.

The thickness of the insulating film 5 is expressed by the equivalent oxide film thickness as defined in the following equation. Here, the concept of the equivalent oxide film thickness is used because it is convenient in view of thickness determination that such plural materials as mentioned above selected for the insulating film 5 are converted to SiO$_2$ thickness.

$$EOT = \frac{\varepsilon_{ox}}{\varepsilon_s} d_s$$

In the equation, EOT is the equivalent oxide film thickness. Besides, $\varepsilon_{ox}$, $\varepsilon_s$ and $d_s$ are the SiO$_2$ dielectric constant, the dielectric constant of the gate insulating film and the film thickness of the gate insulating film 5, respectively.

Figure 8:
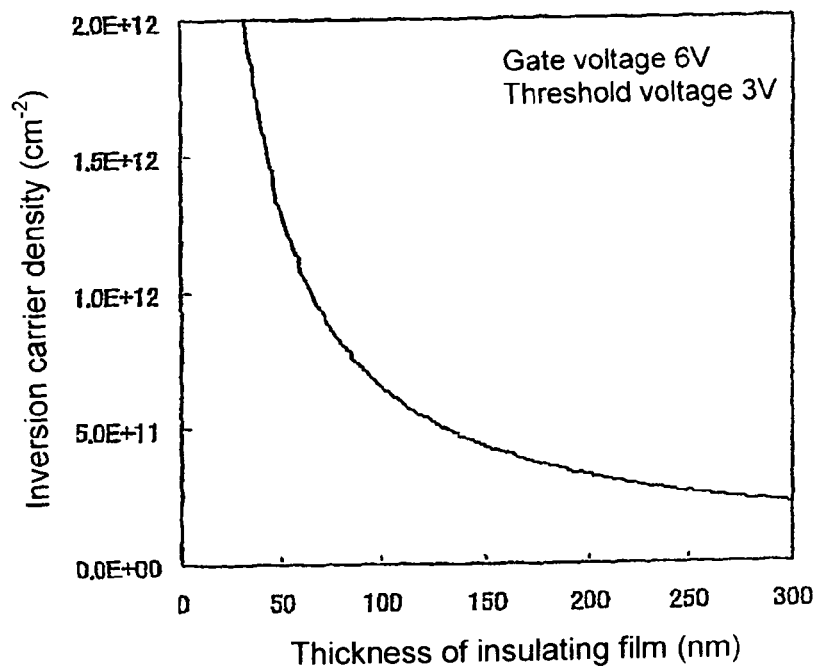
FIG. 8 is a graph of the relation between the inversion carrier density and the thickness of the gate insulating film of the field effect transistor according to the embodiment of the present invention.
Figure 9:
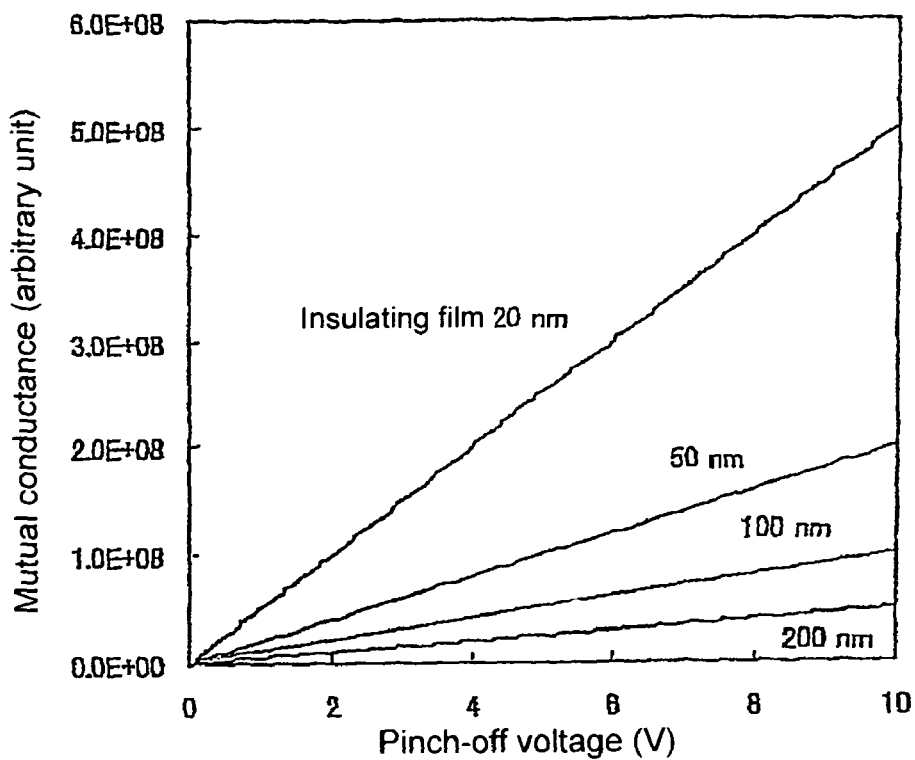
FIG. 9 is a graph of the relation of the mutual conductance, the thickness of the gate insulating film and the pinch-off voltage of the field effect transistor according to the embodiment of the present invention.

The minimum value of the equivalent oxide film thickness is 20 nm in consideration of gate leak. Besides, the maximum value of the equivalent oxide film thickness is preferably 150 nm in consideration of the decrease of the field effect mobility, on-state resistance, mutual conductance shown in FIG. 9 and the inversion carrier density shown in FIG. 8. In FIG. 8, the inversion carrier density is, for example, $5 \times 10^{11}$ cm$^{-2}$ or more, and the greater the density is, the more preferable it is. In FIG. 9, the mutual conductance is preferably greater. In view of this, the equivalent oxide film thickness is preferably 150 nm or less and more preferably 100 nm or less.

Here, in the vertical axis of FIG. 8, 5.0E+11 means $5 \times 10^{11}$, 1.0E+12 means $1 \times 10^{12}$, 1.5E+12 means $1.5 \times 10^{12}$, and 2.0E+12 means $2 \times 10^{12}$. In the vertical axis of FIG. 9, 1.0E+08 to 6.0E+08 indicate $1 \times 10^{08}$ to $6 \times 10^{8}$.

Figure 10:
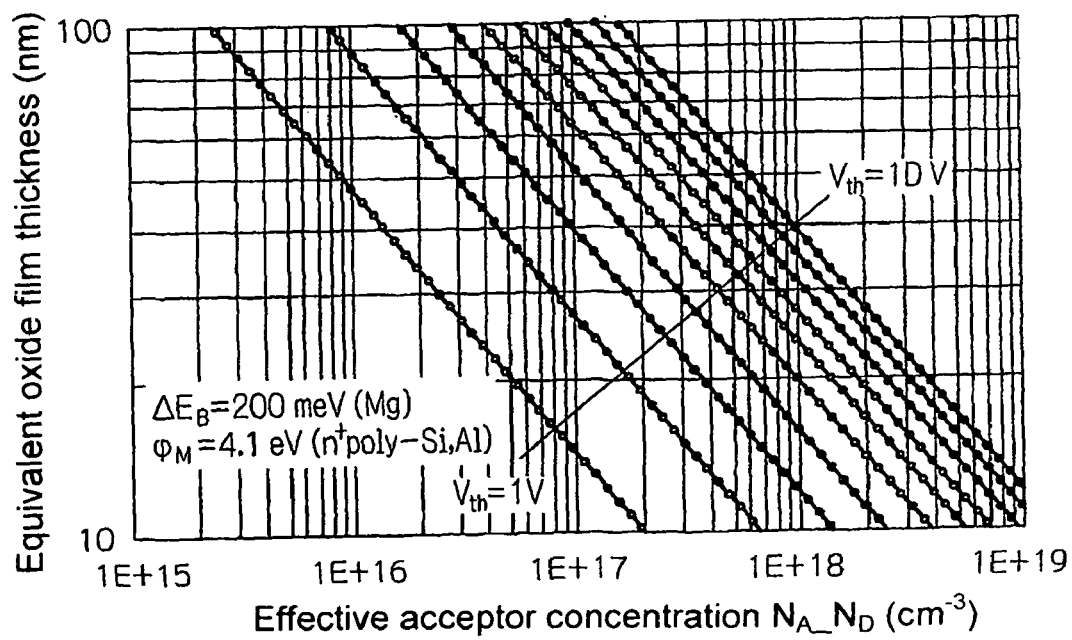
FIG. 10 is a graph of the relation of the equivalent oxide film thickness, the threshold voltage and the effective acceptor concentration of the semiconductor layer of the field effect transistor according to the embodiment of the present invention.

Then, the relation between the equivalent oxide film thicknesses of 10 nm to 100 nm and the effective acceptor concentrations (the effective dopant concentrations) is shown with the threshold voltage as a parameter in FIG. 10. Here, in FIG. 10, the horizontal axis and the vertical axis are indicated by logarithmic scale and ten straight lines from the left hand to the right hand are characteristic lines of 1 V to 10 V, respectively.

The acceptor concentration of the p type GaN layer 3 of the above-described field effect transistor is controlled by the acceptor source gas concentration used in growing of the p type GaN layer 3, however, the adjusted temperature, gas flow rate and the like may have errors, which makes it difficult to control the concentration to be fixed at the same value per substrate with high accuracy. Besides, aggressive introduction of donor at growth of the p type GaN layer 3 is hardly performed, however, crystal defects or impurities contained in the gas or the like act as residual donor, which makes the adjustment difficult.

As a result of this, the effective acceptor concentration shown by the horizontal axis of FIG. 10 sometimes can not be maintained fixed. The effective acceptor concentration is an effective acceptor concentration appearing after compensation of the residual donor and obtained by subtracting the donor concentration from the acceptor concentration.

In consideration of this, it can be said that even with the same equivalent oxide film thicknesses, the threshold voltage varies depending on fluctuation of the effective acceptor concentration.

Then, the equivalent oxide film thickness, that is the thickness of the insulating film 5, is determined by, after growing of the p type GaN layer 3, measuring its effective acceptor concentration and fitting the measured value to the characteristic line of the target threshold voltages shown in FIG. 10.

For example, when the threshold voltage is 3 V and the measured value of the effective acceptor concentration of the p type GaN layer 3 is $5 \times 10^{16}$ cm$^{-3}$, the thickness of the insulating film 5 of silicon oxide film (equivalent oxide film thickness) can be set to about 55 nm based on FIG. 10.

With the field effect transistor having the insulating film 5 with a thus determined thickness, when a predetermined high voltage is applied between the source electrode 6 and the drain electrode 7 with no voltage applied to the gate electrode 8, electrons as carriers do not move substantially in the p type GaN layer 3 between the source region 4s and the drain region 4d and it becomes off state. On the other hand, when a threshold voltage or higher is applied to the gate electrode 8, there is formed an inversion layer in the p type GaN layer 3 under the gate electrode 8, carriers move between the source region 4s and the drain region 4d and it becomes on state.

Second Embodiment

Figure 11:
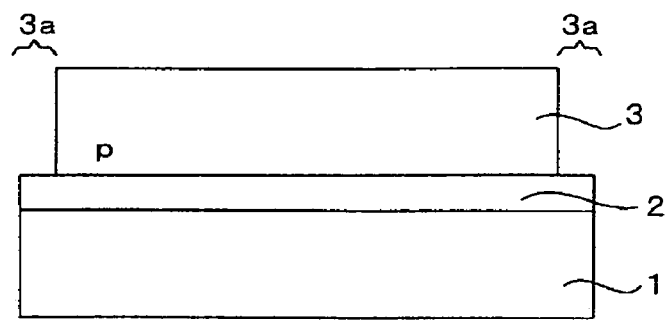
FIG. 11 is a cross sectional view (part 1) illustrating manufacturing steps of a normally-off field effect transistor according to a second embodiment of the present invention.
Figure 11:
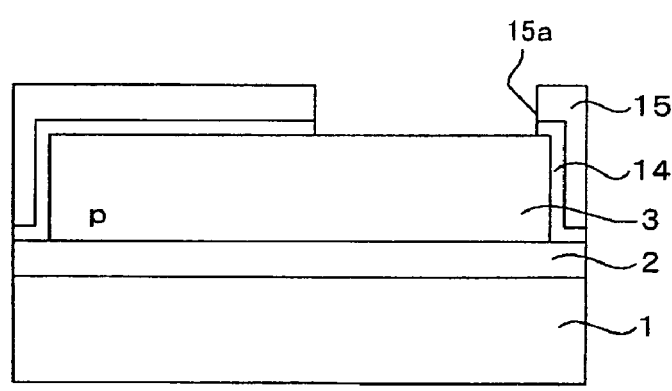
Figure 11:
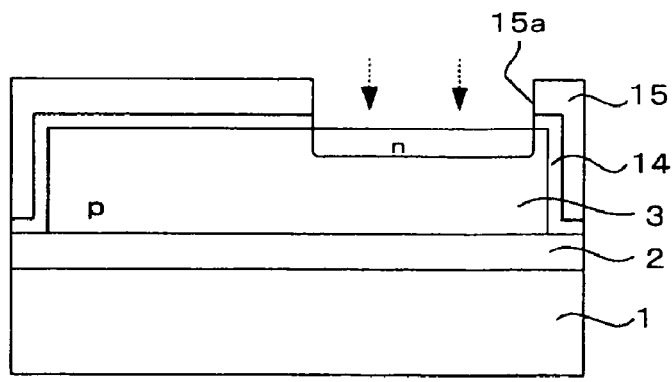

FIG. 11 is a cross sectional view showing a normally-off field effect transistor according to the second embodiment of the present invention and its manufacturing steps. Here, the like reference numerals of FIGS. 1 and 2 denote like elements.

First, as shown in FIG. 11(a), a p type GaN layer 3 is made to grow on the substrate 1 via a buffer layer 2 in the same step as that of the first embodiment, and then, a device separation groove 3a is formed by the photolithography method. Later, the p type GaN layer 3 is subjected to measurement of its effective acceptor concentration.

Next, before formation of a drain region, in order to reduce electric field concentration in the drain region, a RESURF region (electric field reducing region) is formed close to the gate electrode in a region where the drain region is formed. A step of forming the RESURF layer is as follows.

First, as shown in FIG. 11(b), a first $SiO_2$ film 14 having a thickness of about 1 μm is formed over the whole of the p type GaN layer 3 by the CVD method. Then, the film is coated with a photoresist 15, which is exposed and developed to form an opening in a region from the drain region to the end of the gate electrode formed region. Through the opening 15a, a part of the first $SiO_2$ film 14 is etched by buffer hydrogen fluoride to deepen the opening 15a.

Next, as shown in FIG. 11(c), through the opening 15a, silicon which is n type dopant is implanted by ion implantation method into the p type GaN layer 3 at a dose amount of $1 \times 10^{15}$ cm$^{-2}$ or less and at an acceleration voltage of 35 keV to form an n type impurity implanted region 4c. Further, the photoresist 15 is removed by a solvent and the first $SiO_2$ film 14 is removed by a hydrofluoric acid solution.

Figure 12:
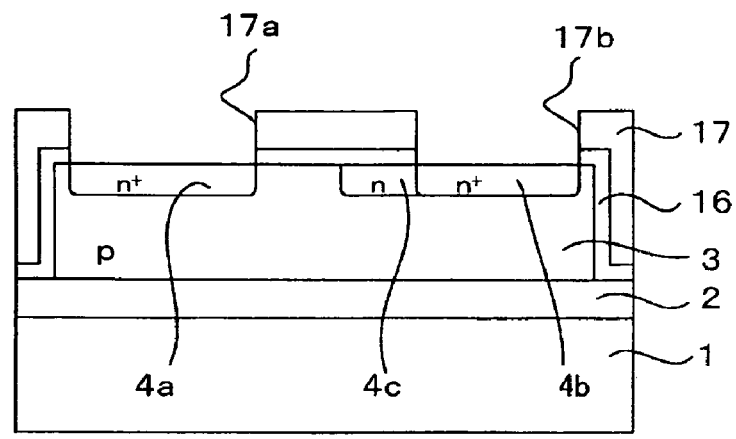
FIG. 12 is a cross sectional view (part 2) illustrating manufacturing steps of the normally-off field effect transistor according to the second embodiment of the present invention.
Figure 12:
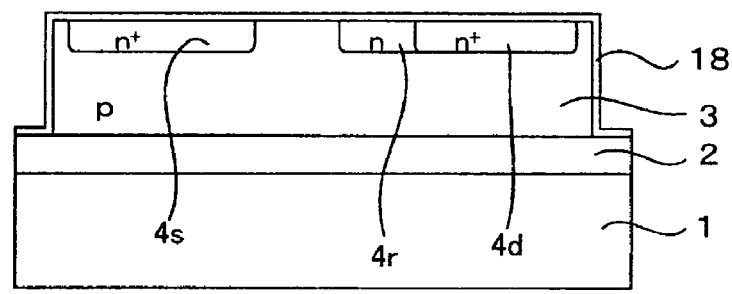
Figure 12:
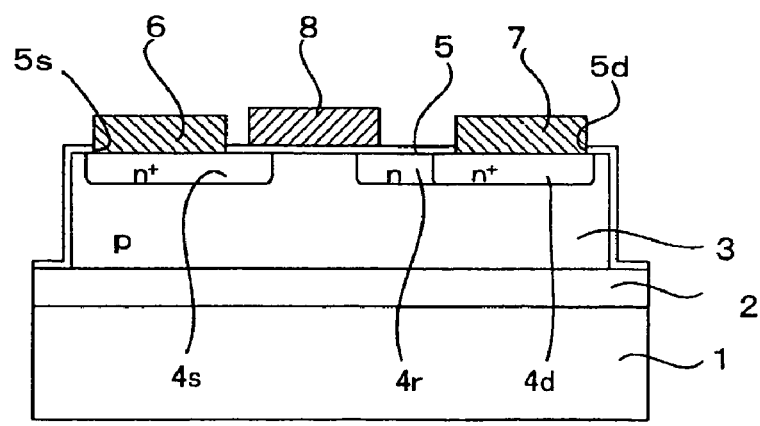

Then, as shown in FIG. 12(a), a second $SiO_2$ film 16 having a thickness of 1 μm is formed on the surface of the p type GaN layer 3, and the film is coated with a photoresist 17, which is exposed and developed to form openings 17a and 17b in the source formed region and the drain formed region.

This is followed by ion implanting of silicon into the p type GaN layer 3 via the openings 17a and 17b at a dose amount of $1 \times 10^{15}$ cm$^{-2}$ and at an acceleration voltage of 35 keV to form a first n+ type dose implanted region 4a and a second n+ type dose implanted region 4b.

After the photoresist 17 and the second $SiO_2$ film 16 are removed, as shown in FIG. 12(b), a $SiO_2$ protective film 18 having a thickness of about 500 nm is formed on the upper surface of the p type GaN layer 3 by the CVD method like in the first embodiment.

Then, in an inactive gas environment, the p type GaN layer 3 is subjected to annealing at a temperature of 1300° C. for five minutes, and impurities in the n type impurity implanted region 4c, the first n$^+$ type impurity implanted region 4a and the second n$^+$ type impurity implanted region 4b are activated to become a n type RESURF region 4r, the n$^+$ type source region 4s, and the n$^+$ type drain region 4d, respectively. Then, the mask layer is removed by hydrofluoric acid solution.

Next, as shown in the first embodiment, the target threshold voltage and the effective acceptor concentration of the p type GaN layer 3 measured in advance are inserted into the relation shown in FIG. 10 to determine the thickness of each insulating film formed in a region between the n$^+$ type source region 4s and the n type RESURF region 4r on the surface of the p type GaN layer 3.

Then, the insulating film with the determined thickness (gate insulating film) 5 is formed on the surface of the p type GaN channel layer 3 before as shown in FIG. 12(c), a source opening 5S and a drain opening 5d are formed on the n$^+$ type source region 4s and the n$^+$ type drain region 4d, respectively, like in the first embodiment. Then, a source electrode 6 is formed in contact with the n$^+$ type source region 4s by the lift-off method and a drain electrode 7 is formed in contact with the n$^+$ type drain region 4d by the lift-off method.

Then, a gate electrode 8 is formed between the n type RESURF region 4r and the n$^+$ type source region 4s on the insulating film 5 on the same conditions as those of the first embodiment.

The field effect transistor formed in the above-described steps is a normally-off transistor, like in the first embodiment, in which a voltage higher than or equal to a threshold voltage is applied to the gate electrode 8 so that an inversion layer is formed in the p type GaN layer 3 to turn on. As the insulating film 5 between the gate electrode 8 and the p type GaN layer 3 is determined by the effective acceptor concentration of the p type GaN layer 3 like in the first embodiment, the threshold voltage can be higher and controlled with high accuracy.

In addition, as the n type RESURF region 4r of lower impurity concentration is formed in adjacent to a region close to the gate electrode 5 in the drain region 4d, it is possible to reduce the electric field concentration in the drain region 4d, and prevent hot carrier implantation and deterioration of device characteristics.

Third Embodiment

Figure 13:
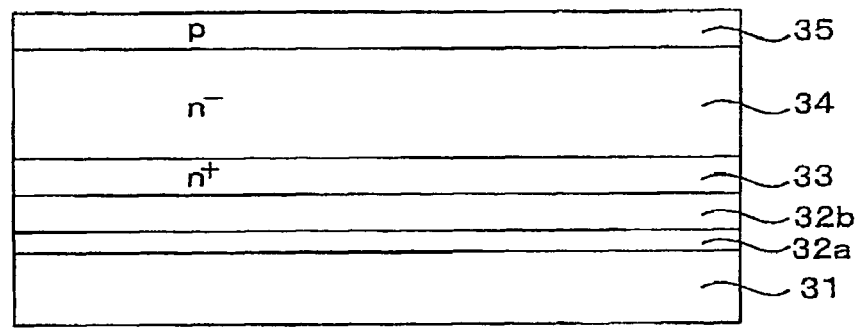
FIG. 13 is a cross sectional view (part 1) illustrating manufacturing steps of a normally-off field effect transistor according to a third embodiment of the present invention.
Figure 13:
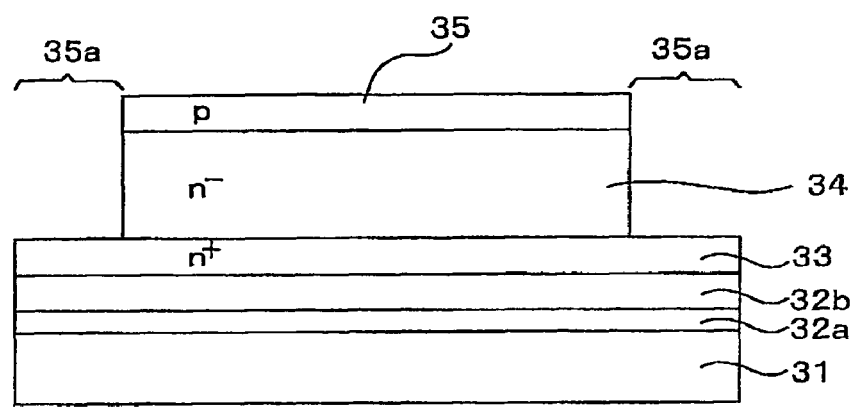
Figure 13:
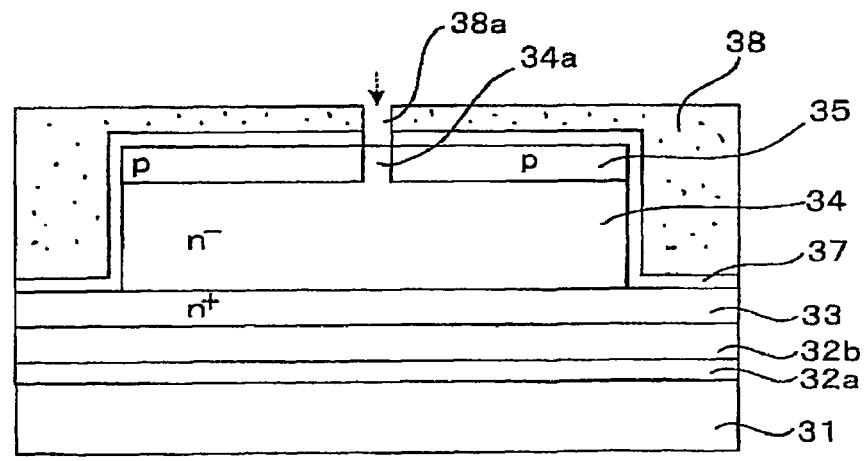
Figure 14:
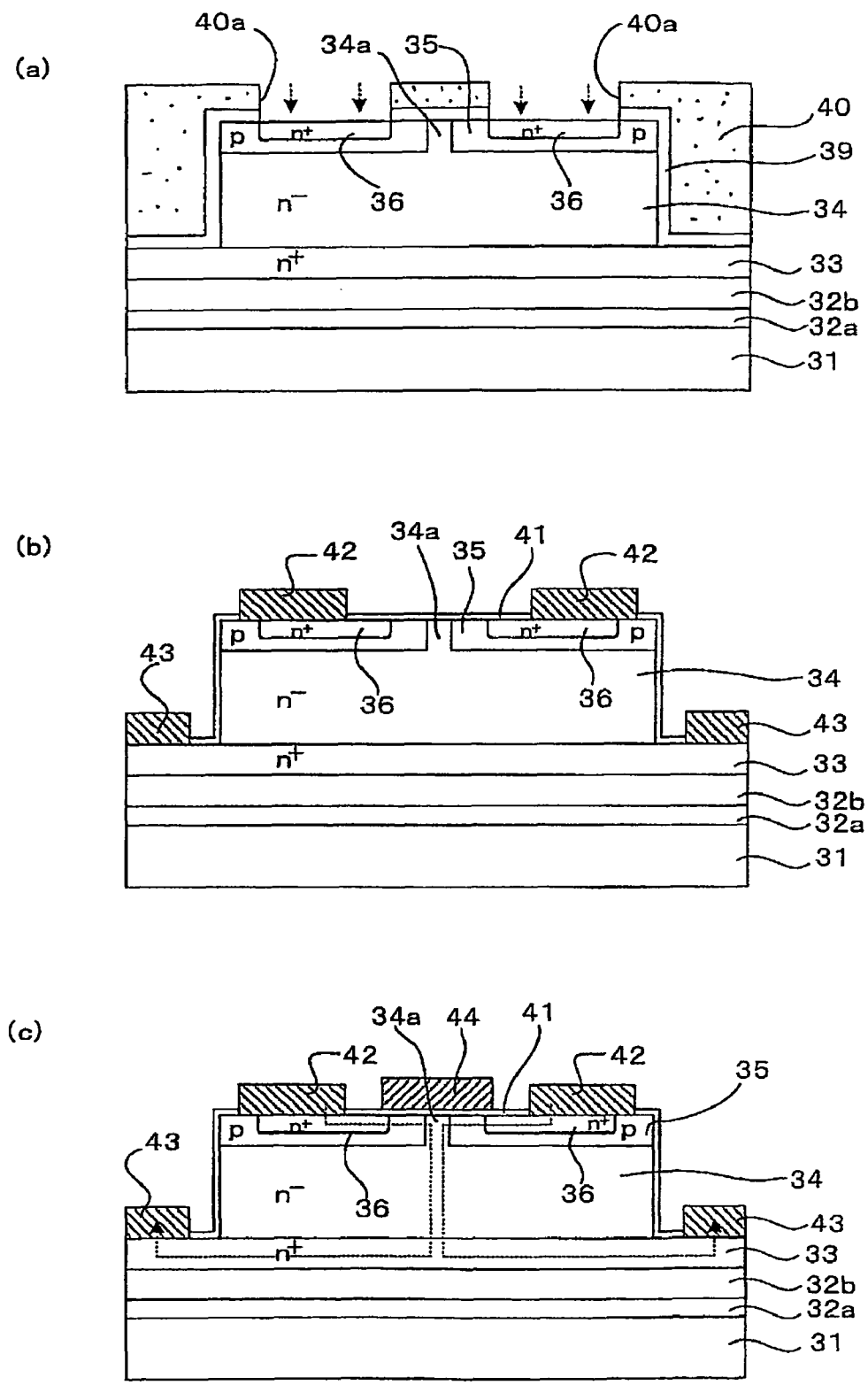
FIG. 14 is a cross sectional view (part 2) illustrating manufacturing steps of the normally-off field effect transistor according to the third embodiment of the present invention.

FIGS. 13 and 14 are cross sectional views showing a normally-off field effect transistor according to a third embodiment of the present invention and its manufacturing method.

First, as shown in FIG. 13(a), a non-doped GaN buffer layer 32a is made to grow on the silicon (Si) substrate 31 by the MOCVD method, on which an AlN buffer layer 32b having a thickness of 100 nm, an n$^+$ type GaN drain layer 33 having a thickness of 1 μm, an n$^-$ type GaN layer 34 having a thickness of 10 nm and a p type GaN layer 35 having a thickness of 1 μm are made to epitaxially grow sequentially. Here, after growing of the p type GaN layer 35, its effective acceptor concentration is measured.

The GaN grows with TMG and ammonia used as reaction gases and AlN grows with TMA and ammonia used as reaction gases. Besides, silicon is used as an n type dopant, disilane ($Si_2H_6$) is used as its reaction gas, Mg is used as a p type dopant and $Cp_2Mg$ is used as its reaction gas. An added amount of Mg ranges, for example, from $5 \times 10^{15}$ cm$^{-3}$ to $5 \times 10^{17}$ cm$^{-3}$. Further, the temperature of the substrate during growth is, for example, 1100° C.

The growth method of GaN and AlN are not limited to the above-mentioned MOCVD method, but may be the HVPE method, the MBE method or the like.

Next, as shown in FIG. 13(b), the p type GaN layer 35 is coated with a photoresist (not shown), which is exposed and developed to form an opening (not shown) to each side in the device region. Through the opening, the p type GaN layer 35 and n$^-$ type GaN layer 34 is etched by the RIE method, ICP etching method or the like to expose a part of the n$^+$ type GaN drain layer 33, which part becomes a drain electrode formed region 35a. Then, the photoresist is removed by a solvent such as acetone or the like.

Then, as shown in FIG. 13(c), a $SiO_2$ film 37 having a thickness of 1 μm is formed on the p type GaN layer 35, the n$^-$ type GaN layer 34 and n$^+$ type GaN drain layer 33 by the CVD method. Further, the film is coated with a photoresist 38, which is exposed and developed to form an opening 38a in the center region in the gate electrode formed region. This is followed by using the photoresist 38 as a mask to etch the $SiO_2$ film 37 by buffered hydrofluoric acid thereby to deepen the opening 38a to expose a part of the p type GaN layer 35.

Later, through the opening 38a, an n type dopant is implanted by thermal diffusion or ion implantation to n type dope a part of the p type GaN layer 35 in a center region in the gate electrode formed region, which part becomes an n⁻ type GaN layer 34a.

Further, the photoresist 38 is removed by a solvent and the SiO₂ film 37 is removed by a by hydrofluoric acid solution.

Next, as shown in FIG. 14(a), a second SiO₂ film 39 having a thickness of 1 μm is formed on the p type GaN layer 35, the n⁻ type GaN layer 34 and n⁺ type GaN drain layer 33 by the CVD method. Further, the film is coated with a photoresist 40, which is exposed and developed to form a source region forming opening 40a to each side of the gate electrode formed region in the p type GaN layer 35. This is followed by using the photoresist 40 as a mask to etch the second SiO₂ film 39 by buffered hydrofluoric acid thereby to deepen the opening 40a to expose a part of the p type GaN layer 35.

Then, the source region forming opening 40a is used to implant Si therein by the ion implantation method at a dose amount of 1×10¹⁵ cm⁻² and at an acceleration voltage of 35 keV. Through this implantation, an n+ type source region 36 is formed. Next, the photoresist 40 is removed by a solvent and the second SiO₂ film 39 is removed by hydrofluoric acid solution.

After the removal, the p type GaN layer 35, the n⁻ type GaN layer 34 and the n⁺ type GaN drain layer 33 are covered with a SiO₂ film (not shown), subjected to annealing in an inactive gas environment at a substrate temperature of 1300° C., and thereby the n+ type source region 36 is activated to become a drain region.

Next, like in the first embodiment, the pre-measured effective acceptor concentration and the threshold voltage are inserted into the relation shown in FIG. 10 to determine a thickness of the insulating film 41 formed on the surface of the p type GaN layer 35 in the gate electrode formed region.

Then, as shown in FIG. 14(b), the insulating film 41 with the determined thickness is formed on the p type GaN layer 35, the n⁻ type GaN layer 34 and the n⁺ type GaN drain layer 33 by the CVD method before a source opening and a drain opening are formed on the n+ type source region 36 and n⁺ type GaN drain layer 33, respectively, and a source electrode 42 is formed in ohmic contact with the n+ type source region 36 by the lift-off method or the like and a drain electrode 43 is formed in ohmic contact with the n⁺ type GaN drain layer 33 by the lift-off method or the like.

The material of the source electrode 42 and drain electrode 43 is Ti/Al, like in the first embodiment, which is in ohmic contact with the n+ type source region 36 and the n⁺ type GaN drain layer 33.

Next, as shown in FIG. 14(c), a gate electrode 44 is formed on the n GaN layer 34a and the p type GaN layer 35 in the gate electrode formed region in adjacent to the n+ type source regions 36 via the insulating film 41 by the lift-off method. The gate electrode 44 may be of polycrystalline silicon formed by the same method as that in the first embodiment or another material.

Through these steps, the normally-off field effect transistor having such a vertical structure is completed.

In the field effect transistor, when a voltage equal to or higher than the threshold voltage is applied to the gate electrode 44, there is formed an inversion layer on the surface of the p type GaN channel layers 35 in adjacent to the source electrodes 42, electrons as carriers moves in the inversion layer as shown by the wavy line in FIG. 14(c) to reach the n⁻ type GaN layer 34a, then moves in the reverse direction to the electric field, that is, from the gate electrode 44 to the n⁺ type GaN drain layer 33, and further, to the drain electrode 43 connected to the n⁺ type GaN drain layer 33.

In this case, when a voltage is applied to between the drain electrode 43 and the gate electrode 44 so that the electric field is generated from the n+ type drain layer 33 toward the gate electrode 44, and voltages are applied to the source electrode 42 and the gate electrode 44 so that electrons move from the source electrodes 42 to the gate electrode 44.

Here, the drain electrode may be formed on the back surface of the silicon substrate 31 by implanting impurity such as phosphorus or the like into the silicon substrate 31 thereby to give the substrate conductivity, containing a high concentration of n type impurity in the GaN buffer layer 32a during growth, and making the n⁺ type GaN drain layer 33 grow thereon without growing of AlN layer 32b. In this case, the back surface of the silicon substrate 31 is about 100 μm in thickness by chemical mechanical polishing (CMP). Besides, the drain electrode is formed by sputtering method or EB method.

Fourth Embodiment

Figure 15:
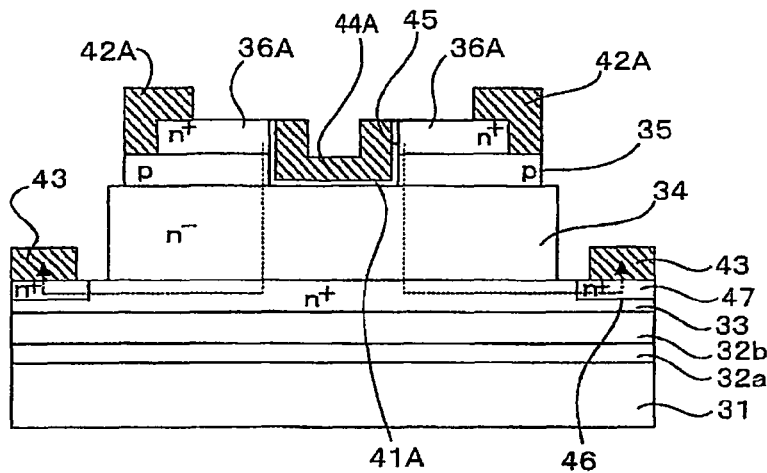
FIG. 15 is a cross sectional view illustrating a first example of a normally-off field effect transistor according to a fourth embodiment of the present invention.

FIG. 15 is a cross sectional view illustrating a normally-off field effect transistor according to the fourth embodiment of the present invention. In FIG. 15, the like reference numerals of FIGS. 13 and 14 indicate the like elements.

In FIG. 15, as is the case with the third embodiment, a GaN buffer layer 32, an AlN buffer layer 32b, an n⁺ type GaN drain layer 33, an n⁻ type GaN layer 34, a p type GaN layer 35 and an n+ type source layer 36A are sequentially made to grow on the silicon substrate 31 by epitaxial growth method or the like. The acceptor concentration and the donor concentration of the p type GaN layer 35 are the same as those of the p type GaN layer 3 of the first embodiment.

In addition, in a gate electrode formed region, a recess 45 is formed having such a depth that the recess extends through the p type GaN layer 35 and the n+ type source layer 36A. In the inner surface of the recess 45, there is formed an insulating film 41A of which the thickness is adjusted so as to obtain a target threshold voltage. As is the case with the first embodiment, the thickness of the insulating film 41A is obtained from the characteristics shown in FIG. 10 based on the effective acceptor concentration of the p type GaN layer 35 and the target threshold voltage.

Besides, on the insulating film 41A in the recess 45, a gate electrode 44A is formed by the lift-off method.

Further, the n+ type source layer 36A is subjected to patterning to sandwich or surround the outer surface of the gate electrode 44A, and the source electrode 42A takes such a shape that it is in ohmic contact with the side surface and the upper surface of the n+ type source layer 36A.

Furthermore, in a region to which the drain electrode 43 is connected in the n+ type drain layer 33, a depressed part 46 is formed by photolithography using a photoresist, and an n⁺ type InGaN contact layer 47 grows epitaxially by the selective growth method of covering a region other than the depressed part with a mask of dielectric film such as silicon oxide film, silicon nitride film or the like.

Further, on the n⁺ type InGaN contact layer 47, the drain electrode 43 is formed which is the same as that in the third embodiment.

In the field effect transistor having such a vertical structure as described above, the transistor is a normally-off type transistor as in the third embodiment, and an inversion layer is formed on the p type GaN layer 35 by applying a threshold voltage or higher voltage to the gate electrode 44A so that carriers passes through the inversion layer and moves between the n+ type source layer 36A and the drain layer 33.

Figure 16:
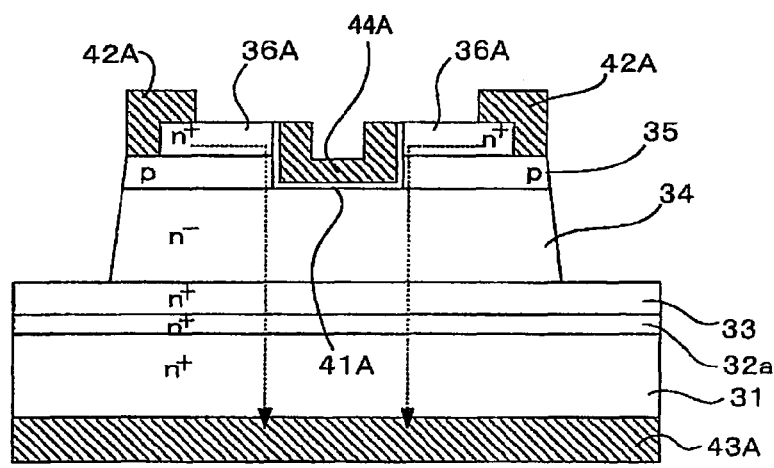
FIG. 16 is a cross sectional view illustrating a second example of the normally-off field effect transistor according to the fourth embodiment of the present invention.

Here, as shown in FIG. 16, the drain electrode may be formed on the back surface of the silicon substrate 31 by implanting impurity such as phosphorus or the like into the silicon substrate 31 thereby to give the substrate conductivity, containing a high concentration of n type impurity in the GaN buffer layer 32a during growth, and making the n+ type GaN drain layer 33 grow thereon without growing of the AlN layer 32b. In this case, the back surface of the silicon substrate 31 is about 100 μm in thickness by chemical mechanical polishing. Besides, the drain electrode 43A is formed by sputtering method or EB method.

Here, in FIG. 16, the side surfaces of the n⁻ type GaN layer 34 and the p type GaN layer 35 are tapered. This tapering is formed by etching to expose the drain layer 33 on the condition that an etching material is adhered again to the etched side surfaces.

Fifth Embodiment

Figure 17:
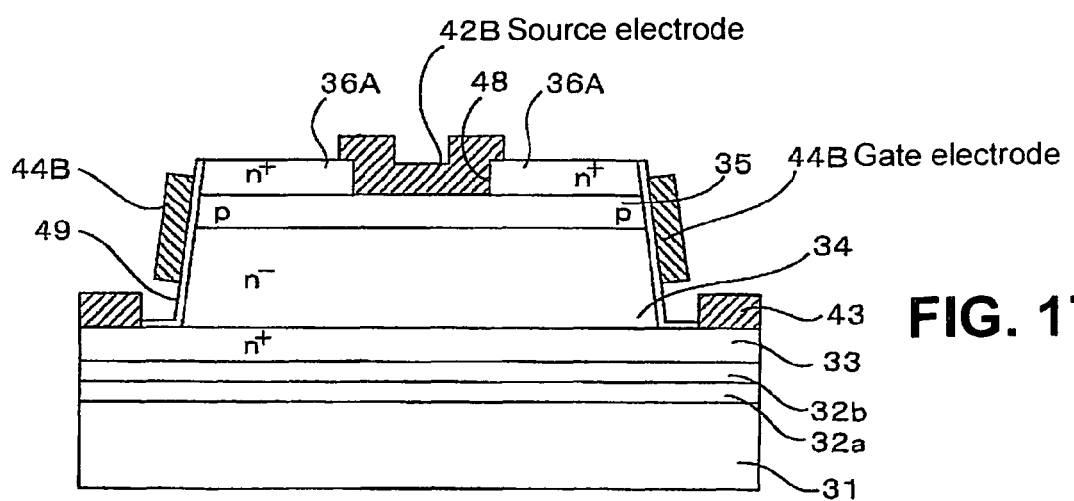
FIG. 17 is a cross sectional view illustrating a first example of a normally-off field effect transistor according to a fifth embodiment of the present invention.

FIG. 17 is a cross sectional view showing a normally-off field effect transistor according to the fifth embodiment of the present invention. In FIG. 17, the same reference numerals as those in FIGS. 13, 14 and 15 indicates like elements.

In FIG. 17, on the silicon substrate 31, as is the case with the fourth embodiment, the GaN buffer layer 32a, the AlN buffer layer 32b, the n+ type GaN drain layer 33, the n⁻ type GaN layer 34, the p type GaN layer 35 and the n+ type source layer 36A are sequentially made to grow by the epitaxial growth method, The concentrations of the donor and the acceptor of the p type GaN layer 35 are the same as those of the p type GaN layer 3 of the first embodiment.

In addition, the n⁻ type GaN layer 34, the p type GaN layer 35 and the n+ type source layer 36A are subjected to mesa patterning to expose a part of the drain layer 33. In this case, the side surfaces of them are tapered. This tapering is formed by etching to expose the drain layer 33 on the condition that an etched material is adhered again to the etched side surfaces.

In the center of the n+ type source layer 36A, there is formed a recessed part 48, in which the source electrode 42B is formed by the lift-off method. On the side surfaces of the mesa-shaped p type GaN layer 35, gate electrodes 44B are formed via insulating films (gate insulating films) 49.

Insulating film 49 is formed of the same material as that of the insulating film 5 under the gate electrode 5 in the first embodiment, and the thickness of the insulating film 41A is obtained from the characteristics as shown in FIG. 10 on the basis of the effective acceptor concentration of the p type GaN layer 35 and the target threshold voltages.

In addition, the gate electrode 44B is formed on the side of the p type GaN layer 35 on the deposition conditions having isotropy. A material of the gate electrode 44B is the same as that of the gate electrode 8 of the first embodiment. Further, on the insulating film 41A inside the recess 45, there is formed a gate electrode 44A by the lift-off method. Furthermore, the drain electrodes 43 are formed on the n+ type drain layer 33 by the lift-off method In the field effect transistor having such a vertical structure as described above, the transistor is a normally-off type transistor as in the fourth embodiment, and an inversion layer is formed on the p type GaN layer 35 by applying a threshold voltage or higher voltage to the gate electrode 44B so that carriers passes through the inversion layer and moves between the n+ type source layer 36A and the drain layer 33.

Figure 18:
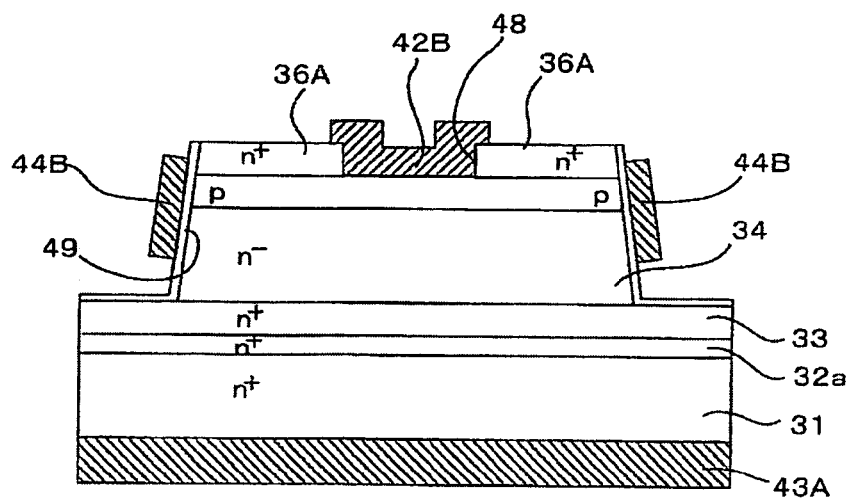
FIG. 18 is a cross sectional view illustrating a second example of the normally-off field effect transistor according to the fifth embodiment of the present invention.
Figure 19:
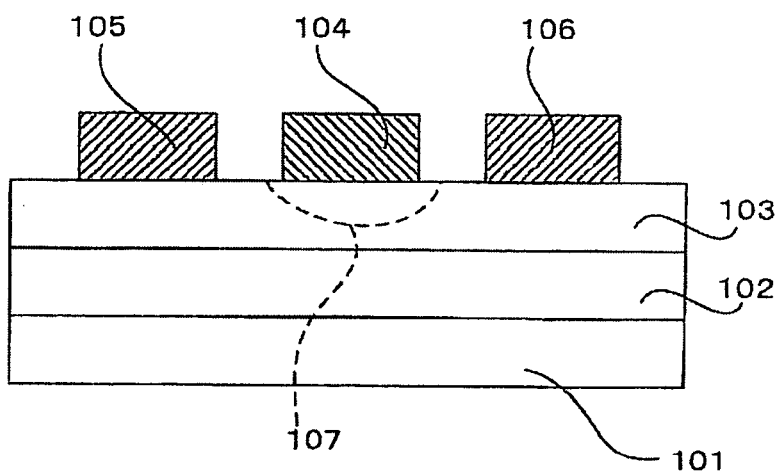
FIG. 19 is a cross sectional view illustrating an example of a normally-on MESFET according to the conventional art.
Figure 20:
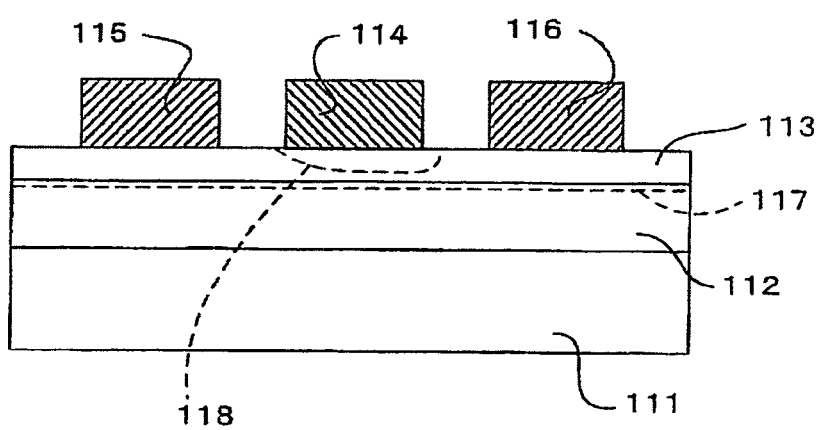
FIG. 20 is a cross sectional view illustrating an example of a normally-on high electron mobility transistor according to the conventional art.

Here, as illustrated in FIG. 18, the drain electrode 43A may be formed on the back surface of the silicon substrate 31 by implanting impurity such as phosphorus or the like into the silicon substrate 31 thereby to give the substrate conductivity, containing a high concentration of n type impurity in the GaN buffer layer 32a during growth, and making the n+ type GaN drain layer 33 grow thereon without growing of AlN layer 32b. In this case, the back surface of the silicon substrate 31 is about 100 μm in thickness by chemical mechanical polishing. Besides, the drain electrode 43A is formed by sputtering method or EB method.

Here, the channel layer formed in this embodiment is not limited to the GaN layer but may be InGaN, AlInGaN, GaNP, GaNAs or another III-nitride semiconductor.

Next description is made about yet another embodiment with reference to the drawings.

Sixth Embodiment

A field effect transistor using III-nitride semiconductor according to the sixth embodiment will be described based on FIGS. 21 to 24. This III-nitride semiconductor is a normally-off MOS field effect transistor (herein after referred to as MOSFET).

The MOSFET 200 has a substrate 201, a first conductive type semiconductor layer 203 using III-nitride semiconductor formed on the substrate 201, a gate electrode 208 formed on a channel region 203a of the fiest conductive type semiconductor layer 203 via a gate oxide film (gate insulating film) 205, a source electrode 206 and a drain electrode 207. Further, this MOSFET 200 has second conductive type contact regions 210 and 211 which are formed on the respective sides of the channel region 203a of the first conductive type semiconductor layer 203 and are in ohmic contact with the source electrode 206 and the drain electrode 207, respectively. Further, the MOSFET 200 has a RESURF region 212 formed between the gate electrode 208 and the drain electrode 207 in the channel region 203a of the first conductive semiconductor layer 203.

The substrate 201 used in the MOSFET 200 is a sapphire substrate, Si substrate or the like.

The first conductive type semiconductor layer 203 is a p type GaN layer having p type conductivity formed by using GaN as a III-nitride semiconductor to make GaN doped with a predetermined amount of p type impurity, for example, Mg to epitaxially grow on the substrate 201. The gate oxide film 205 is, for example SiO₂ film.

The second conductive type contact region 210 is an n+ type GaN layer (n+ type source region) having n type conductivity formed by implanting n type impurity, for example, Si to the first conductive semiconductor layer 203, which is the p type GaN layer, by ion implantation method. Likewise, the second conductive type contact region 211 is an n+ type GaN layer (n+ type drain region) having n conductivity formed by implanting n type impurity, for example, Si to the first conductive semiconductor layer 203 by ion implantation.

The RESURF region (Reduced SURface Field: RESURF region) 212 is a surface electric field reducing region formed between the gate electrode 208 and the drain electrode 207 in the first conductive semiconductor layer 203. This RESURF region 212 is an n GaN layer formed by ion-implanting n type impurity, for example, Si, into the first conductive semiconductor layer 203 which is the p type GaN layer. Thus, the MOSFET 200 is an N-channel MOSFET.

In the RESURF MOSFET having the RESURF region 212 as in this GaN MOSFET 200, if the carrier concentration (concentration of n type impurity such as Si) is low in the RESURF region 212, there occurs dielectric breakdown in the semiconductor at the drain end (the first conductive semiconductor layer 203 as the p type GaN layer). On the other hand, if the carrier concentration at the RESURF region 212 is high, there occurs dielectric breakdown in the semiconductor to the drain side under the gate electrode 208. However, usually, the electric field density of the gate electrode 208 and the RESURF region 212 is increased and therefore, the dielectric breakdown occurs in the gate oxide film 205 at a voltage lower than the voltage of dielectric breakdown of the RESURF region. Therefore, the carrier concentration of the RESURF region 212 has its optimal value. Here, when the carrier concentration of the RESURF region 212 is low, the resistance at the RESURF region 212 becomes higher to decrease the current. In this way, the carrier concentration of the RESURF region 212 needs to be higher to some extent and however, if the carrier concentration becomes too high, the breakdown voltage becomes lowered.

Then, in the sixth embodiment, in order to realize both higher breakdown voltage and larger current in the GaN MOSFET 200, the sheet carrier concentration of the RESURF region 212 is set to fall within a range between $1 \times 10^{12}$ cm$^2$ and $5 \times 10^{13}$ cm$^{-2}$, inclusive, and the sheet resistance of the RESURF region 212 is set to fall within a range between 100 Ω/sq. and 10 kΩ/sq., inclusive.

(Relation Between the Sheet Resistance of the RESURF Region 212 and the Drain Current)

Figure 21:
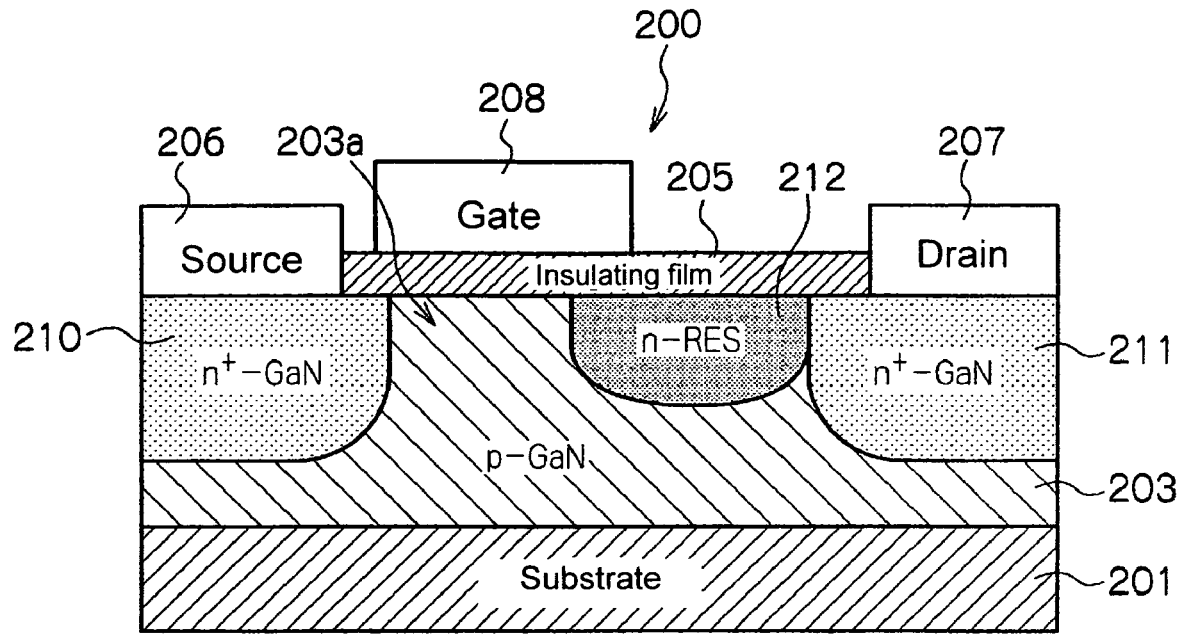
FIG. 21 is a cross sectional view illustrating a field effect transistor according to a 2-1 embodiment of the present invention.
Figure 22:
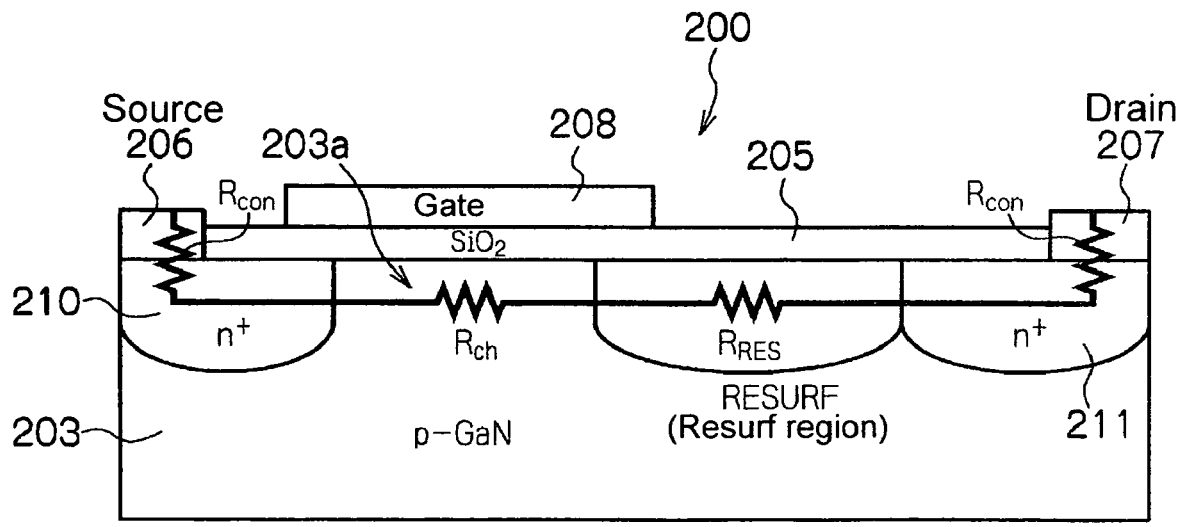
FIG. 22 is a pattern diagram illustrating each resistance of current paths in the field effect transistor according to the 2-1 embodiment.

FIG. 22 is a pattern diagram illustrating each resistance of current paths in the GaN MOSFET 200 described with reference to FIG. 21. The on-state resistance $R_{NR}$ of the NR (Non-RESURF) MOSFET with no RESURF region is series resistor of a resistance component $R_{con}$ which exists between the source electrode and the contact region (n$^+$ type GaN layer), a channel resistor $R_{ch}$ and a resistance component $R_{con}$ which exists between the drain electrode and the contact region (n$^+$ type GaN layer). Meanwhile, the on-state resistance of the GaN MOSFET 200 which is the RESURF MOSFET having the RESURF region 212 is a value obtained by adding a resistance component $R_{RES}$ of the RESURF region 212 to the channel resistance $R_{ch}$.

The drain current Id of the NR (Non-RESURF) MOSFET is expressed by the following equation.

(linear region)
$$I_d = \frac{1}{2} \frac{W_{ch}}{L_{ch}} \mu_{NR} C_{ox} \{2(V_g - V_{sh}) V_{di} \dots V_{di}^2\} \quad (1)$$

(saturation region)
$$I_d = \frac{1}{2} \frac{W_{ch}}{L_{ch}} \mu_{NR} C_{ox} (V_g - V_{sh})^2 \quad (2)$$

$$C_{ox} = \frac{\varepsilon_o \varepsilon_{ox} S}{d_{ox}} \quad (3)$$

$W_{ch}$ and $L_{ch}$ are a channel width and a channel length, respectively. $\mu_{NR}$ is a mobility of the NR MOSFET. In other words, the mobility is that obtained after being affected by the resistance of the contact parts of the source and drain and channel. $C_{ox}$ is a oxide film capacity and $V_g$, $V_{th}$, and $V_{ds}$ are gate, voltage, threshold voltage and drain voltage. $\varepsilon_o$ and $\varepsilon_{ox}$ are the dielectric constant of the vacuum and the dielectric constant of the oxide film, respectively. S and $d_{ox}$ are an area of the gate oxide film and film thickness, respectively.

The drain current $I_{d,RES}$ of the GaN MOSFET 200 which is the RESURF MOSFET is expressed by the following equation.

$$I_{d,RES} = \frac{V_{ds}}{R_{NR} + R_{RES}} = \frac{V_{ds}}{\frac{V_{ds}}{I_d} + \frac{l_{RES}}{W_{ch}} R_{RES,sheet}} \quad (4)$$

where $L_{RES}$ is a RESURF length (length of the RESURF region 212), and $R_{RES,Sheet}$ is a sheet resistance of the RESURF region 212.

Figure 23:
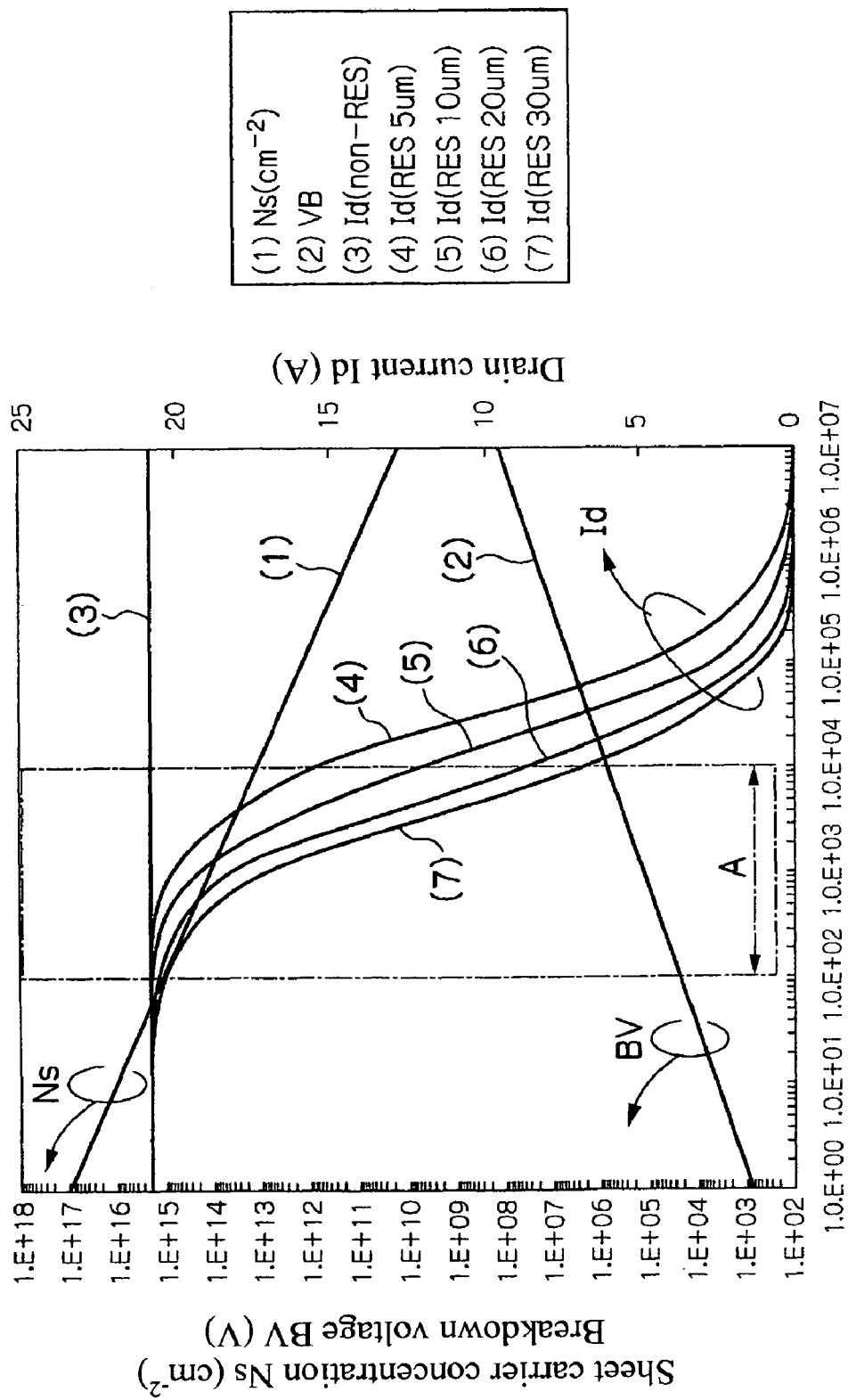
FIG. 23 is a graph showing the relation between the drain current and the sheet resistance of the RESURF region, together with the sheet carrier concentration of the RESURF region and the breakdown voltage.

FIG. 23 illustrates a relation between drain currents Id (A) and sheet resistance $R_s$ (Ω/sq.) of the RESURF region 212. In FIG. 23, the horizontal axis indicates the sheet resistance $R_s$ (Ω/sq.), the right-hand vertical axis indicates the drain current $I_d$ (A) and the left-side vertical axis indicates the sheet carrier concentration $N_s$ (cm$^{-2}$) and the breakdown voltage BV (V).

In addition, in FIG. 23, the straight line (1) shows a change in sheet carrier concentration $N_s$, the straight line (2) shows a change in breakdown voltage BV, the straight line (3) shows a change in drain current $I_d$ when no RESURF region is formed, and the curved lines (4), (5), (6) and (7) show changes in drain current for the RESURF lengths (lengths of the RESURF region 212) of 5 μm, 10 μm, 20 μm, and 30 μm, respectively. Here, the calculation results shown in FIG. 23 are given with the gate width of 200 mm.

As is seen from the calculation results in FIG. 23, when the sheet resistance is 10 kΩ/sq. or less, the drain current becomes 10 A or more. In other words, when the drain current is maintained at the practical level of 10 A or more, the sheet resistance is preferably 10 kΩ/sq. ($1 \times 10^4$ Ω/sq.) or less.

When the sheet resistance is greater than $1 \times 10^4$ Ω/sq., the drain current becomes too small undesirably. Meanwhile, at the lower limit of the sheet resistance ($1 \times 10^2$ Ω/sq. or more), even if the sheet resistance is less than $1 \times 10^2$ Ω/sq., the drain current is fixed approximately at 20 A. Therefore, the lower limit of the sheet resistance is fixed at ($1 \times 10^2$ Ω/sq. or more).

Accordingly, after intensive study of the inventors, in order to obtain the drain current at a practical level of 10 A or more, the sheet resistance of the RESURF region 212 is preferably set or controlled to fall within a range from 100 Ω/sq. to 10 kΩ/sq., inclusive, (range indicated by A in FIG. 23).

Here, as is seen from FIG. 23, when the sheet resistance of the RESURF region 212 is set to fall within a range from 100 Ω/sq. to 10 kΩ/sq., inclusive, the breakdown voltage BV falls within a range approximately from $1 \times 10^4$ to $1 \times 10^5$ (V) and the sheet carrier concentration Ns (cm$^{-2}$) falls within a range about from $1 \times 10^{13}$ (cm$^{-2}$) to $1 \times 10^{15}$ (cm$^{-2}$).

Figure 24:
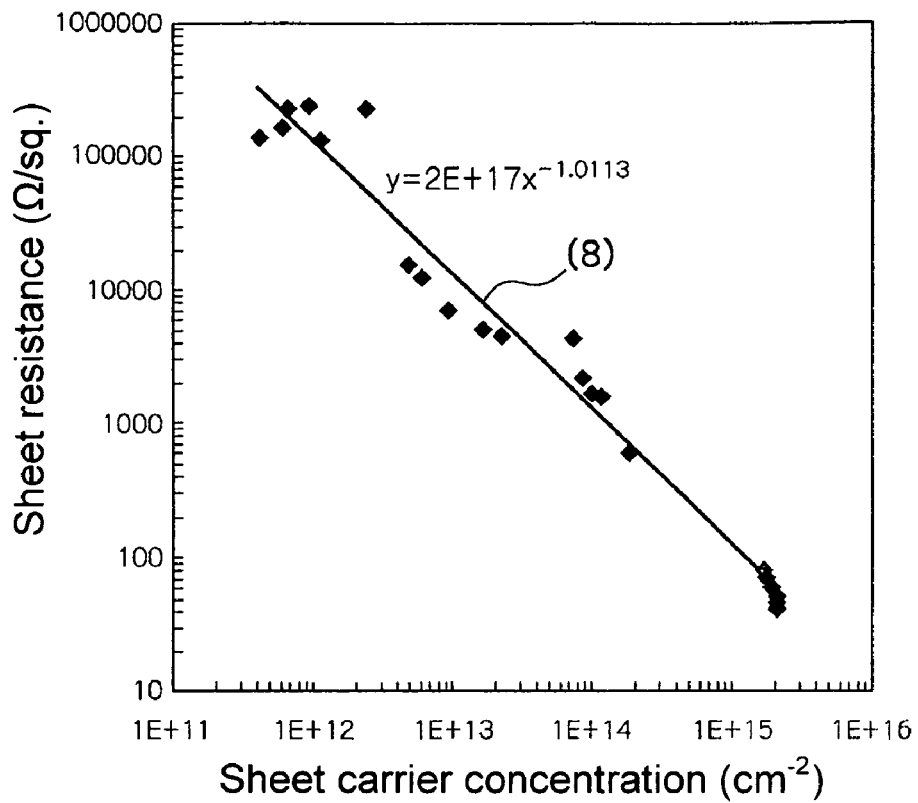
FIG. 24 is a graph illustrating the sheet resistance and the sheet carrier concentration.

FIG. 24 shows a relation between the sheet carrier concentration of the RESURF region 212 and the sheet resistance. Also as is seen from FIG. 24, the sheet carrier concentration needs to be $5 \times 10^{12}$ cm$^{-2}$ or more in order to obtain the sheet resistance of 10 kΩ/sq. ($1 \times 10^4$ Ω/sq.) or less.

As described up to this point, in the GaN MOSFET 200, in order to obtain both of higher breakdown voltage and larger current, the sheet carrier concentration of the RESURF region 212 is set to fall within a range from $1 \times 10^{12}$ cm$^{-2}$ to $5 \times 10^{13}$ cm$^{-2}$, inclusive, and the sheet resistance of the RESURF region 212 is set to fall within a range from 100 Ω/sq. to 10 kΩ/sq., inclusive.

Here, in order to realize a normally-off operation with a higher-threshold or a threshold of 3-5 (V) in the normally-off MOS field effect transistor (MOSFET) 200, the acceptor concentration, for example, Mg concentration, of the first conductive type semiconductor layer 203 that is the p type GaN layer needs to be controlled to fall within a range between $1\times10^{15}$ cm$^{-3}$ and $5\times10^{17}$ cm$^{-3}$, inclusive.

Next description is made about a manufacturing method of the GaN MOSFET 200 according to the sixth embodiment shown in FIG. 21.

(Crystal Growth Step) First, the p type GaN layer (the first conductive type semiconductor layer 203) is made to epitaxially grow on the sapphire substrate (substrate 201) by the MOCVD (Metal Organic Chemical Vapor Deposition) method. The dopant used here is Mg and Mg concentration is controlled to fall within a range between $1\times10^{15}$ cm$^{-3}$ and $5\times10^{17}$ cm$^{-3}$ inclusive.

Here, the above-mentioned MOCVD method may be replaced with the HVPE (Hydride Vapor Phase Epitaxy) method, the MBE method (Molecular Beam Epitaxy) or the like. Besides, the substrate 201 may be of Si, SiC, ZrB2 or the like. In addition, the dopant may be Be, Zn, C or the like.

(Device Separation Step)

Next, the surface of the p type GaN layer (the first conductive type semiconductor layer 203) is coated with a photoresist and photolithography is performed to carry out patterning of the device separation.

Then, a dry etching apparatus (ICP, RIE or the like) is used to etch the p type GaN layer.

This is followed by removing of the photoresist by acetone. This completes the device separation.

(Implantation Step)

Next, the first mask layer (SiO$_2$) having a thickness of 1 μm is formed.

Then, an opening for the second conductive type contact region (n$^+$ type GaN layer, n$^+$ type source region) 210 and an opening for the contact region (n$^+$ type GaN layer, n$^+$ type drain region) 211 is formed in the photolithography step.

Next, Si (silicon) is implanted toward the openings of the first mask layer by ion implantation method at four steps: in the first step, doze amount: $3\times10^{14}$ cm$^{-3}$ and acceleration voltage: 30 keV, in the second step, doze amount: $4\times10^{14}$ cm$^{-3}$ and acceleration voltage: 60 keV, in the third step, doze amount: $8\times10^{14}$ cm$^{-3}$ and acceleration voltage: 120 keV, and in the fourth step, doze amount: $1.5\times10^{15}$ cm$^{-3}$ and acceleration voltage: 160 keV. With this implantation, the second conductive type contact region 210 which is the n+ type source region and the second conductive type contact region 211 which is the n+ type drain region are formed. However, in the second conductive type contact regions 210 and 211 formed here, the ion-implanted impurity is not activated.

Then, the first mask layer is removed by a hydrofluoric acid solution.

[RESURF Region Forming Step]

Next, the second mask layer (SiO$_2$) is formed having a thickness of 1 μm. Then, an opening for the RESURF region 212 is formed ini the photo step.

Next, Si (silicon) is implanted toward the opening of the second mask layer by ion implantation at four steps: in the first step, doze amount: $1\times10^{13}$ cm$^{-3}$ and acceleration voltage: 30 keV, in the second step, doze amount: $1.4\times10^{13}$ cm$^{-3}$ and acceleration voltage: 60 keV, in the third step, doze amount: $2.6\times10^{13}$ cm$^{-3}$ and acceleration voltage: 120 keV, and in the fourth step, doze amount: $5\times10^{13}$ cm$^{-3}$ and acceleration voltage: 160 keV. With this implantation, the RESURF region 212 is formed (however, the ion-implanted impurity is not yet activated).

Next, the second mask layer is removed by the hydrofluoric acid solution.

Here, the doze amount of the RESURF region 212 may be changed in accordance with the activation rate. Then, the third mask layer (SiO$_2$ layer) having a thickness of 500 nm is formed over the whole surface of the device. Next, the device is subjected to annealing in an N (nitrogen) environment at 1260° C. for 30 seconds. This activates the ion-implanted impurity.

Then, the third mask layer is removed by the hydrofluoric acid solution.

[Ohmic Electrode Forming Step]

Next, the gate oxide film (SiO$_2$ layer) 205 is formed over the p type GaN layer (the first conductive type semiconductor layer 203).

Then, the in the gate oxide film 205, an opening for the source electrode 206 and an opening for the drain electrode 207 are formed in the photolithography step.

Next, the ohmic electrodes of Ti/Al (the source electrode 206 and the drain electrode 207) are formed on the p type GaN layer exposed in the gate oxide film 205.

Here, the ohmic electrodes may be electrodes other than Ti/Al electrodes as far as the ohmic contact is realized.

[Gate Electrode Forming Step]

Next, poly-Si is deposited over the surface of the device by LPCVD method, sputtering or the like.

Then, the poly-Si is subjected to doping at 900° C. for twenty minutes in a thermal diffusion furnace filled with POCl$_3$ gas.

After that, photolithography step is performed so that the poly-Si can remain between the source electrode 206 and the drain electrode 207. With this step, the gate electrode 208 is completed.

Here, the doping method of the poly-Si may be thermal diffusion method after P (Phosphorus) deposition. Or, the gate electrode 208 may be Au, Pt, Ni or the like.

After these steps, the MOSFET 200 shown in FIG. 21 can be completed.

According to the thus-structured sixth embodiment has the following effect.

As the RESURF region 212 is provided in the MOSFET 200, the breakdown voltage can be increased. As the sheet carrier concentration of the RESURF region 212 is set to fall within a range from $1\times10^{12}$ cm$^{-2}$ to $5\times10^{13}$ cm$^{-2}$, inclusive, and the sheet resistance of the RESURF region is sent to fall within a range from 100 Ω/sq. to 10 kΩ/sq., inclusive, it is possible to realize the normally-off MOSFET 200 having higher breakdown voltage and larger current.

As the sheet carrier concentration of the RESURF region 212 is set to fall within a range from $5\times10^{12}$ cm$^{-2}$ to $5\times10^{13}$ cm$^2$, it is possible to realize the normally-off MOSFET 200 having a further reduced sheet resistance, higher breakdown voltage and further greater current. As the first conductive type semiconductor layer 203 is a P TYPE GaN layer and the RESURF region 212 is an n GaN layer in the N-channel GaN MOSFET 200, both of higher breakdown voltage and larger current can be achieved.

As the RESURF region 212 is an n type GaN layer formed by ion implanting n type impurity into the first conductive type semiconductor layer 203 which is the p type GaN layer, the sheet carrier concentration is not affected much by the p type impurity concentration of the p type GaN layer.

As the p type impurity concentration of the first conductive type semiconductor layer 203 that is the p type GaN layer is set to fall within a range between $1\times10^{15}$ cm$^{-3}$ to $5\times10^{17}$ cm$^{-3}$, inclusive, in the normally-off MOSFET 200, it is possible to realize normally-off operation having a higher threshold voltage, e.g., a threshold voltage of about 3-5 V.

When the film thickness of the first conductive type semiconductor layer (p type GaN layer) 203 remains the same and the p type impurity concentration (for example, Mg concentration) is increased, the breakdown voltage is lowered. This is because when the p type impurity concentration is higher, the depletion layer under the drain-side n+ type layer (the second conductive type contact region 211 in ohmic contact with the drain electrode 207) is reduced thereby to cause concentration of the electric field, which leads to breakdown. As the p type impurity concentration of the first conductive type semiconductor layer 203 which is the p type GaN layer is set to fall within a range from $1 \times 10^{15}$ cm$^{-3}$ to $5 \times 10^{17}$ cm$^{-3}$, inclusive, the threshold voltage of the normally-off concentration can be made larger. However, after intensive study by the inventors, it is found that the p impurity concentration is pertinent not only to the threshold voltages but also to the breakdown voltage. In other words, when the p type impurity concentration is higher, the breakdown voltage is decreased for the above-mentioned reasons. As the p type impurity concentration is set to fall within a range between $10 \times 10^{15}$ cm$^{-3}$ and $5 \times 10^{17}$ cm$^{-3}$, it is possible to prevent decrease of the breakdown voltage.

Seventh Embodiment

Figure 25:
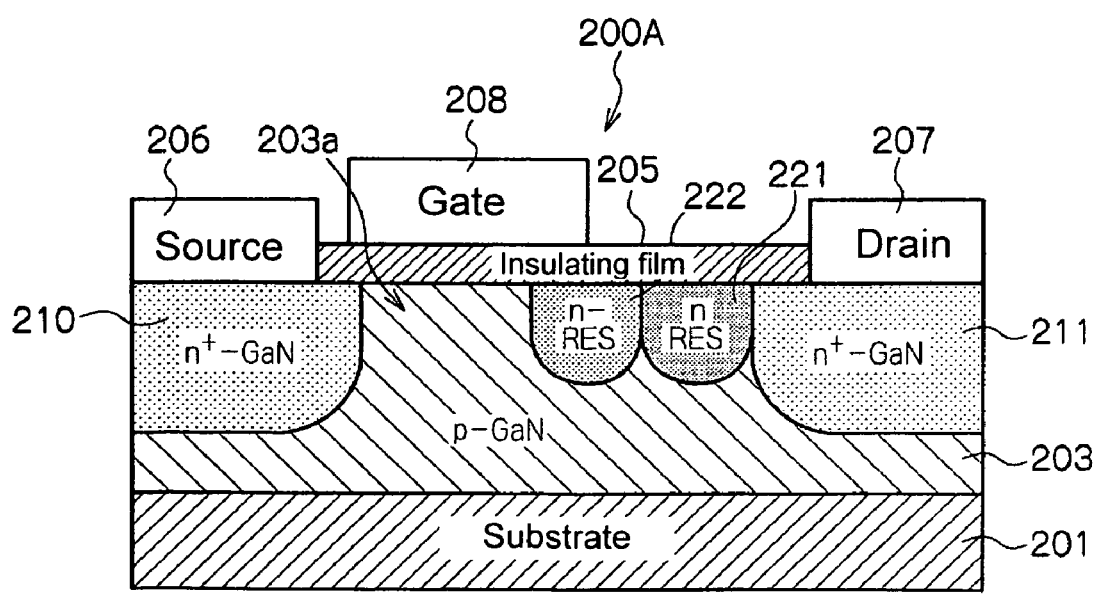
FIG. 25 is a cross sectional view illustrating a field effect transistor according to a 2-2 embodiment of the present invention.

Next description is made of a field effect transistor using a III-nitride semiconductor with reference to FIG. 25.

In the MOS field effect transistor (MOSFET) described in the above sixth embodiment, one RESURF region 212 is formed. On the other hand, the field effect transistor (MOSFET) 200A using the III-nitride semiconductor according to the seventh embodiment has two RESURF regions 221 and 222 arranged horizontally in the direction of X indicated in FIG. 26(A). Out of the two RESURF regions 221 and 222, the carrier concentration (doping concentration of n type impurity such as Si) of the RESURF region 222 arranged to the gate electrode 208 side is lowered and the carrier concentration of the RESURF region 221 arranged to the drain region 207 side is increased. Other structures of MOSFET 200A are the same as those of the MOSFET 200 according to the first embodiment.

Figure 26:
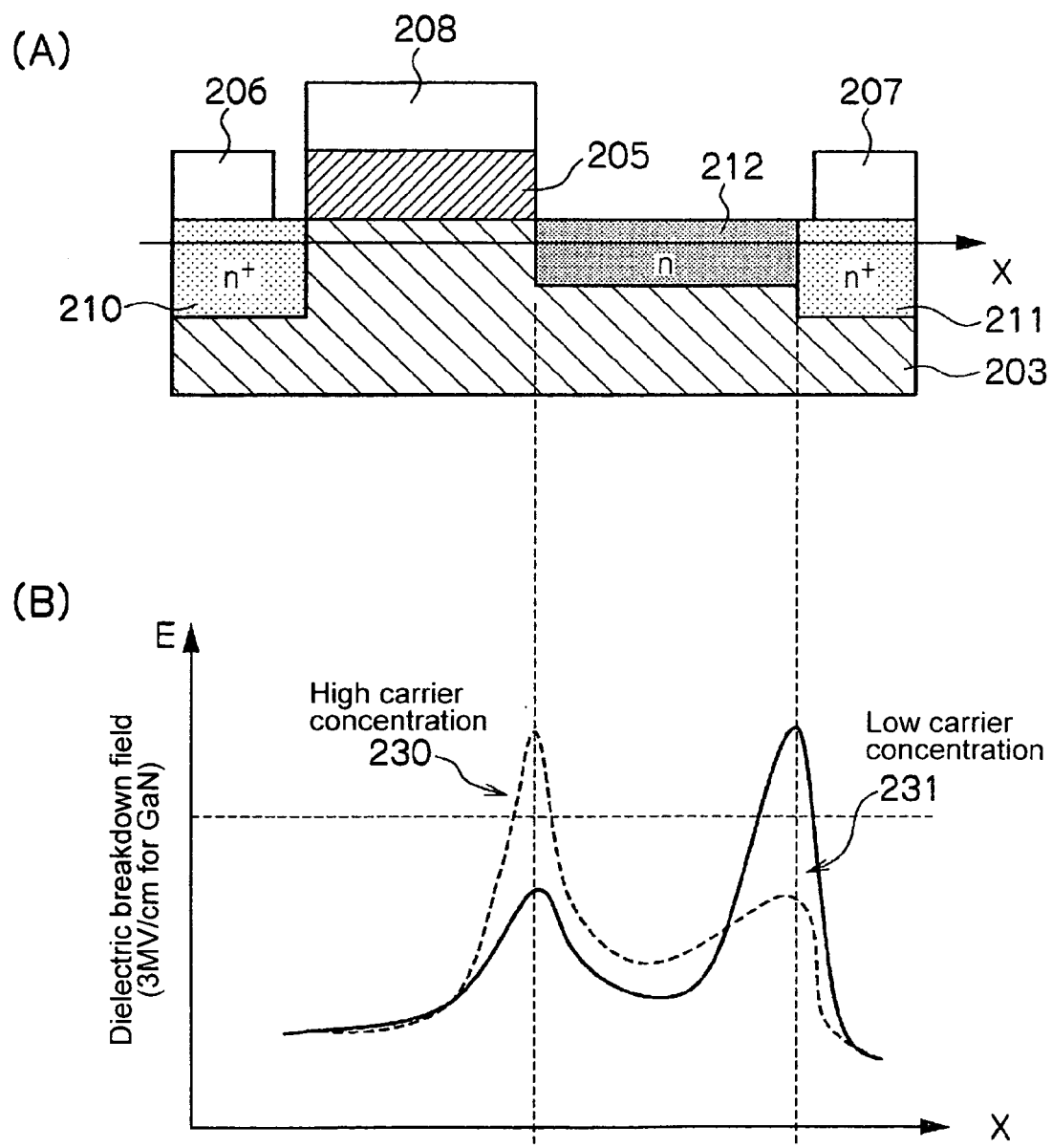
FIG. 26(A) is a cross sectional view schematically illustrating the structure of the field effect transistor according to the first embodiment.
FIG. 26(B) is a graph showing the electric field strength at each position of the above-mentioned field effect transistor.
Figure 27:
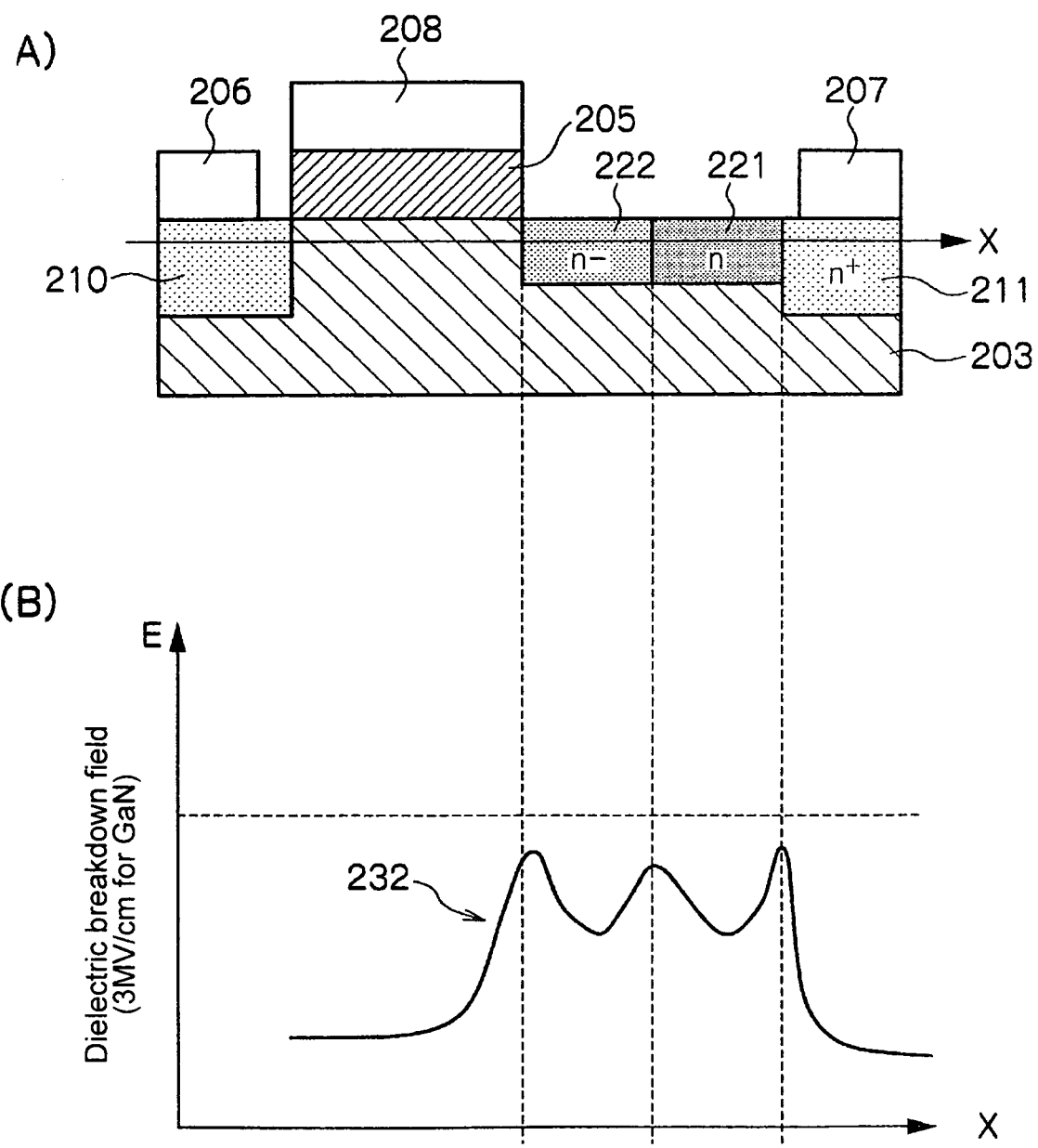
FIG. 27(A) is a cross sectional view schematically illustrating the structure of the field effect transistor according to the second embodiment.
FIG. 27(B) is a graph showing the electric field strength at each position of the above-mentioned field effect transistor.

Next description is made about differences in operational effects between the MOSFET 200 and the MOSFET 200A, with reference to FIGS. 26(A) and 26(B), and 27(A) and (B). FIG. 26(A) is a cross sectional view showing a structural outline of the MOSFET 200 according to the sixth embodiment. FIG. 26(B) is a graph showing electric field strength of each position of the MOSFET 200. Likewise, FIG. 27(A) is a cross sectional view showing a structural outline of the MOSFET 200A according to the seventh embodiment. FIG. 27(B) is a graph showing electric field strength of each position of the MOSFET 200A.

In the MOSFET 200 having the one RESURF region 212, when the carrier concentration of the RESURF region 212 (doping concentration of the n type impurity such as Si) is higher, as shown by the curved line 230 in FIG. 26(B), there occurs an electric field having a strength exceeding dielectric breakdown field (3 MV/cm for GaN) in the first conductive type semiconductor layer 203 to the drain side under the gate electrode 208. This makes the gate oxide film 205 cause a dielectric breakdown with dielectric breakdown voltage lower than that of the first conductive type semiconductor layer 203. On the other hand, when the carrier concentration of the RESURF region 212 is lower, as indicated by the curved line 231 in FIG. 26(B), there occurs an electric field having a strength exceeding the dielectric breakdown field in the first conductive type semiconductor layer 203 at the drain end. This makes the first conductive type semiconductor layer 203 at the drain end cause a dielectric breakdown. Hence, there is an optimal value of the carrier concentration of the RESURF region 212.

On the other hand, in the MOSFET 200A having the two RESURF regions 221 and 222, out of the two RESURF regions 221 and 222 arranged horizontally (in the X direction), when the carrier concentration of the RESURF region 222 to the gate electrode 208 side is lowered (n− layer) and the carrier concentration of the RESURF region 221 to the drain electrode 207 side is increased (n layer) (see FIG. 27(A)). With this structure, as indicated by the curved line 232 in FIG. 27(B), the electric field having a strength exceeding the dielectric breakdown field strength is not caused either in the first conductive type semiconductor layer 203 to the drain side under the gate electrode 208 nor in the first conductive type semiconductor layer 203 at the drain end.

The thus-structured embodiment 7 has the following operational effects other than the effects of the above-mentioned sixth embodiment. The MOSFET 200A of the seventh embodiment has the two RESURF regions 221 and 222, the carrier concentration of the RESURF region 222 to the gate electrode 208 side is decreased and the carrier concentration of the RESURF region 221 to the drain electrode 207 side is increased. With this structure, the strength of the electric field that occurs in each of the first conductive type semiconductor layer 203 to the drain side under the gate electrode 208 and each part of the first conductive type semiconductor layer 203 at the drain end can be made lower than the dielectric breakdown field strength. Accordingly, when the two RESURF regions are provided, it is possible to reduce the electric field concentration more and obtain a higher breakdown voltage than the case of two RESURF regions.

This is because when there is one RESURF region, the electric field concentrates on the boundary between the second conductive type contact region (n$^+$ type GaN layer) 211 and the RESURF region 212 and on the boundary between the RESURF region 212 and the first conductive type semiconductor layer (p type GaN layer) 203, and therefore, the electric field concentration is divided into two parts. On the other hand, when there are two RESURF regions, the electric field concentrates on the boundary between the second conductive type contact region 211 and the RESURF region 221, on the boundary between the RESURF region 221 and the RESURF region 222 and on the boundary between the RESURF region 222 and the first conductive type semiconductor layer 203, that is, the electric field concentration is divided into three parts, and therefore, the electric field concentration is more relaxed in the case of two RESURF regions than in the case of on RESURF region.

As is the case with two RESURF regions, if there are three or more RESURF regions, the electric field concentration is more relaxed and higher breakdown voltage can be obtained.

Here, the present invention can be modified and embodied as follows.

In the above-described embodiments, the MOSFET 200, 200A that are N-channel MOSFET are referred, however, the present invention is also applicable to a P TYPE channel MOSFET.

The invention claimed is:

1. A field effect transistor comprising:
a substrate;
a semiconductor layer of a first conductivity-type III-nitride semiconductor formed on the substrate, the semiconductor layer including a channel region;
a gate insulating film formed on the channel region;
a gate electrode formed on the gate insulating film;
source and drain contact regions of a second conductivity type formed on respective sides of the channel region;
source and drain electrodes formed in ohmic contact with the source and drain contact regions, respectively; and a RESURF region formed in the channel region and adjacent to the drain contact region, the RESURF region having a sheet carrier concentration ranging from $1\times10^{12}$ cm$^{-2}$ to $5\times10^{13}$ cm$^{-2}$, wherein the semiconductor layer is a p-type GaN layer, the RESURF region is an n-type GaN layer formed by ion-implanting an n-type impurity into the p-type GaN layer, and the p-type GaN layer of the semiconductor layer has a p-type impurity concentration ranging from $1\times10^{15}$ cm$^{-3}$ to $5\times10^{17}$ cm$^{-3}$.

2. The field effect transistor according to claim 1, wherein the field effect transistor is a normally-off MOS field effect transistor.

3. A field effect transistor, comprising:

a substrate;

a semiconductor layer of a first conductivity-type III-nitride semiconductor formed on the substrate, the semiconductor layer including a channel region;

a gate insulating film formed on the channel region;

a gate electrode formed on the gate insulating film;

source and drain contact regions of a second conductivity type formed on respective sides of the channel region;

source and drain electrodes formed in ohmic contact with the source and drain contact regions, respectively; and a RESURF region formed in the channel region and adjacent to the drain contact region, the RESURF region having a sheet carrier concentration ranging from $1\times10^{12}$ cm$^{-2}$ to $5\times10^{13}$ cm$^{-2}$, wherein the RESURF region includes a plurality of regions having different sheet carrier concentrations, the sheet carrier concentrations being higher in an area adjacent to the drain electrode and lower in an area adjacent the gate electrode.

4. The field effect transistor according to claim 3, wherein the field effect transistor is a normally-off MOS field effect transistor.

5. A method of manufacturing a field effect transistor, the method comprising:

growing a III-nitride semiconductor layer on a substrate to obtain a semiconductor layer formed of a first conductivity-type III-nitride semiconductor including a channel region;

forming source and drain contact regions of a second conductivity type on respective sides of the channel region;

forming a RESURF region in the channel region adjacent to the drain contact region by ion-implantation with a sheet carrier concentration ranging from $1\times10^{12}$ cm$^{-2}$ to $5\times10^{13}$ cm$^{-2}$;

forming a gate insulating film on the channel region;

forming a gate electrode on the gate insulating film; and forming source and drain electrodes in ohmic contact with the source and drain contact regions, respectively, wherein the RESURF region is formed by the ion-implantation to include a plurality of regions having different sheet carrier concentrations, the sheet carrier concentrations being higher in an area adjacent to the drain electrode and lower in an area adjacent to the gate electrode.

6. A method of manufacturing a field effect transistor, the method comprising:

growing a III-nitride semiconductor layer on a substrate to obtain a semiconductor layer of a first conductivity-type III-nitride semiconductor including a channel region;

forming source and drain contact regions of a second conductivity type on respective sides of the channel region;

forming a RESURF region in the channel region adjacent to the drain contact region by ion-implantation with a sheet carrier concentration ranging from $1\times10^{12}$ cm$^{-2}$ to $5\times10^{13}$ cm$^{-2}$;

forming a gate insulating film on the channel region;

forming a gate electrode on the gate insulating film; and forming source and drain electrodes in ohmic contact with the source and drain contact regions, respectively, wherein the semiconductor layer is a p-type GaN layer, the RESURF region is an n-type GaN layer formed by ion-implanting an n-type impurity into the p-type GaN layer; and the p-type GaN layer of the semiconductor layer has a p-type impurity concentration ranging from $1\times10^{15}$ cm$^{-3}$ to $5\times10^{17}$ cm$^{-3}$.

\* \* \* \* \*